United States Patent
Pešić

(10) Patent No.: US 11,961,910 B2
(45) Date of Patent: Apr. 16, 2024

(54) MULTI-METAL LATERAL LAYER DEVICES WITH INTERNAL BIAS GENERATION

(71) Applicant: Applied Materials, Inc., Santa Clara, CA (US)

(72) Inventor: Milan Pešić, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/002,670

(22) Filed: Aug. 25, 2020

(65) Prior Publication Data
US 2022/0069131 A1  Mar. 3, 2022

(51) Int. Cl.
H01L 29/78 (2006.01)
H01G 4/005 (2006.01)
H01L 29/22 (2006.01)
H10B 51/00 (2023.01)
H10B 53/00 (2023.01)

(52) U.S. Cl.
CPC ....... H01L 29/78391 (2014.09); H01G 4/005 (2013.01); H01L 29/22 (2013.01); H10B 51/00 (2023.02); H10B 53/00 (2023.02)

(58) Field of Classification Search
CPC ......... H01L 29/78391; H01L 27/11502; H01L 27/11585; H01L 29/22; H01G 4/005
See application file for complete search history.

(56) References Cited

U.S. PATENT DOCUMENTS

| | | | |
|---|---|---|---|
| 2017/0358599 A1 | 12/2017 | Ramaswamy et al. | |
| 2018/0323214 A1 | 11/2018 | Karda et al. | |
| 2020/0357821 A1* | 11/2020 | Chen | H01L 27/11597 |
| 2021/0050359 A1* | 2/2021 | Kai | H01L 27/11597 |
| 2021/0111179 A1* | 4/2021 | Shivaraman | H01L 27/11507 |
| 2021/0202703 A1* | 7/2021 | Rajashekhar | H01L 29/40117 |
| 2021/0242241 A1* | 8/2021 | Rajashekhar | H01L 29/40117 |
| 2021/0264959 A1* | 8/2021 | Rabkin | H01L 29/778 |
| 2021/0272983 A1* | 9/2021 | Gilbert | H01L 45/10 |

(Continued)

FOREIGN PATENT DOCUMENTS

| | | |
|---|---|---|
| CN | 109449289 A | 3/2019 |
| CN | 110690177 A | 1/2020 |
| WO | 2018-236353 A1 | 12/2018 |

OTHER PUBLICATIONS

International Search Report and Written Opinion dated Dec. 8, 2021 in International Patent Application No. PCT/US2021/046543, 7 pages.

(Continued)

*Primary Examiner* — Bitew A Dinke
(74) *Attorney, Agent, or Firm* — Kilpatrick Townsend & Stockton LLP

(57) ABSTRACT

A ferroelectric capacitor or a ferroelectric transistor may include a first metal layer having a first metal having a first work function, and a second metal layer having a second metal having a second work function. The capacitor may also include a a vertical electrode and a ferroelectric material that surrounds the vertical electrode and forms a plurality of switching regions in the ferroelectric material. The transistor may include a vertical channel, a vertical buffer layer that surround the vertical channel, and a ferroelectric material that surrounds the vertical buffer layer and forms a plurality of gate regions in the ferroelectric material.

20 Claims, 25 Drawing Sheets

(56) References Cited

U.S. PATENT DOCUMENTS

| | | | | |
|---|---|---|---|---|
| 2021/0358925 A1* | 11/2021 | Takahashi | ......... | H01L 27/11587 |
| 2021/0375888 A1* | 12/2021 | Lu | ..................... | H01L 29/66969 |
| 2021/0375930 A1* | 12/2021 | Lu | ..................... | H01L 29/40111 |
| 2021/0375933 A1* | 12/2021 | Lu | ........................ | H01L 29/516 |
| 2021/0375937 A1* | 12/2021 | Wu | ................... | H01L 27/11587 |
| 2021/0399013 A1* | 12/2021 | Wu | ................... | H01L 27/11587 |
| 2021/0399015 A1* | 12/2021 | Lin | ................... | H01L 27/11597 |
| 2021/0408018 A1* | 12/2021 | Haratipour | ............ | G11C 11/221 |

OTHER PUBLICATIONS

Application No. PCT/US2021/046543, International Preliminary Report on Patentability, dated Mar. 9, 2023, 6 pages.

\* cited by examiner

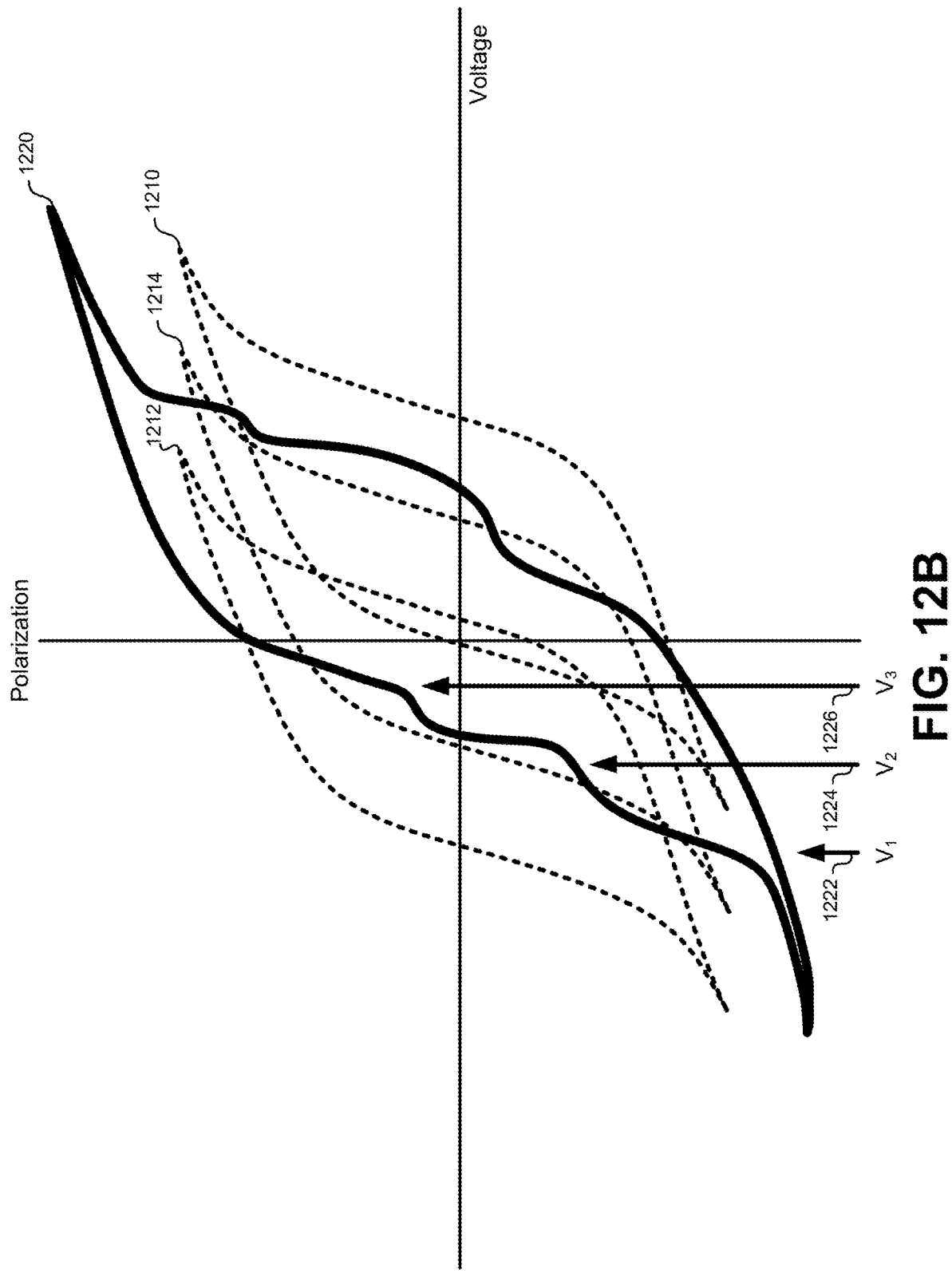

MULTI-METAL LATERAL LAYER DEVICES WITH INTERNAL BIAS GENERATION

BACKGROUND

A modern electronic neural network includes digital and/or analog circuitry that is inspired by, and seeks to approximate, the biological neural networks used by neurological systems found in nature. Like their natural counterparts, electronic neural networks attempt to learn and perform various tasks and recognize input stimuli without being pre-programmed using tasks-specific rules. This learning process may be accomplished using a collection of connected nodes representing artificial neurons which operationally approximate the behavior of neurons in a biological system. Connections between neurons may approximate the behavior of biological synapses to transmit signals between one or more artificial neurons. Multiple successive layers of neuron-and-synapse connections can be chained together to break complex tasks down into incremental stages. Therefore, an electronic neural network can be taught to perform new tasks in the same way that biological neural networks learn and grow over time.

SUMMARY

In some embodiments, a ferroelectric capacitive device may include a plurality of metal layers that may include a first metal layer comprising a first metal having a first work function and a second metal layer comprising a second metal having a second work function that is different from the first work function, where the first metal layer is approximately parallel to the second metal layer. The ferroelectric capacitive device may also include a vertical contact that contacts the first metal layer, a vertical electrode that is approximately perpendicular to the first metal layer and approximately perpendicular to the second metal layer, and a ferroelectric material that surrounds the vertical electrode and contacts the vertical electrode and the plurality of metal layers to form the ferroelectric capacitive device with a plurality of switching regions in the ferroelectric material. The plurality of switching regions may include a first switching region between the vertical electrode and the first metal layer and a second switching region between the vertical electrode and the second metal layer.

In some embodiments, a method of fabricating a ferroelectric capacitive device may include depositing a plurality of metal layers that may include a first metal layer having a first metal having a first work function and a second metal layer having a second metal having a second work function that is different from the first work function, where the first metal layer is approximately parallel to the second metal layer. The method may also include etching a vertical hole in the plurality of metal layers and filling the vertical hole with a vertical electrode that is approximately perpendicular to the first metal layer and approximately perpendicular to the second metal layer, and a ferroelectric material that surrounds the vertical electrode and contacts the vertical electrode and the plurality of metal layers to form the ferroelectric capacitive device with a plurality of switching regions in the ferroelectric material. The plurality of switching regions may include a first switching region between the vertical electrode and the first metal layer, and a second switching region between the vertical electrode and the second metal layer.

In any embodiments, any and/or all of the following features may be incorporated in any combination and without limitation. The ferroelectric capacitive device may also include an isolator layer between the first metal layer and the second metal layer. The vertical contact may also contact the second metal layer. The ferroelectric capacitive device may also include a second vertical contact that contacts the second metal layer, where the vertical contact does not contact the second metal layer, and the second vertical contact does not contact the first metal layer. The plurality of metal layers may further include a third metal layer having a third metal having a third work function that is different from the first work function and different from the second work function. No isolator barrier may be between the first metal layer and the second metal layer such that the first metal layer provides an electrical contact between the second metal layer and the vertical contact. The vertical electrode may include a vertical cylinder inside of the ferroelectric material such that the ferroelectric material contacts each of the plurality of metal layers. A second ferroelectric capacitive device may be stacked on top of the ferroelectric capacitive device and a third ferroelectric capacitive device may be beneath the ferroelectric capacitive device in a vertical stack. The plurality of metal layers may be connected to a plate line of a memory cell in a memory array, and the vertical electrode may be connected to a drain a transistor of the memory cell. The vertical electrode may be connected to a gate of a transistor of a memory cell in a memory array.

In some embodiments, a ferroelectric transistor may include a plurality of metal layers including a first metal layer having a first metal having a first work function; and a second metal layer having a second metal having a second work function that is different from the first work function, where the first metal layer is approximately parallel to the second metal layer. The ferroelectric transistor may also include a vertical contact that may contact the first metal layer. The ferroelectric transistor may further include a vertical channel that may be approximately perpendicular to the first metal layer and approximately perpendicular to the second metal layer; a vertical buffer layer that may surround the vertical channel; and a ferroelectric material that may surround the vertical buffer layer and contact the plurality of metal layers to form the ferroelectric transistor with a plurality of gate regions in the ferroelectric material. The plurality of gate regions may include a first gate region between the vertical channel and the first metal layer and a second gate region between the vertical channel and the second metal layer.

In any embodiments, any and/or all of the following features may be incorporated in any combination and without limitation. The ferroelectric transistor may also include an isolator layer between the first metal layer and the second metal layer. The vertical contact may also contact the second metal layer. The ferroelectric transistor may also include a second vertical contact that may contact the second metal layer, where the vertical contact does not contact the second metal layer, and the second vertical contact does not contact the first metal layer. The plurality of metal layers may also include a third metal layer including a third metal having a third work function that is different from the first work function and different from the second work function. No isolator barrier need be formed between the first metal layer and the second metal layer such that the first metal layer provides an electrical contact between the second metal layer and the vertical contact. A second ferroelectric transistor may be stacked on top of the ferroelectric transistor and a third ferroelectric transistor may be beneath the ferroelectric transistor in a vertical stack such that the vertical channel is shared between the ferroelectric transistor, the second ferroelectric transistor, and the third ferroelectric transistor. The ferroelectric transistor may include a first doped semiconductor region on a bottom of the vertical stack forming a drain for the ferroelectric transistor, the second ferroelectric transistor, and the third ferroelectric transistor; and a second doped semiconductor region on a top of the vertical stack forming a source for the ferroelectric transistor, the second ferroelectric transistor, and the third ferroelectric transistor. The vertical channel may include an indium gallium zinc oxide (IGZO) material.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components.

FIG. 12B illustrates an aggregation of the effect of the multiple hysteresis curves illustrated in FIG. 12A, according to some embodiments.

DETAILED DESCRIPTION

Figure 1:
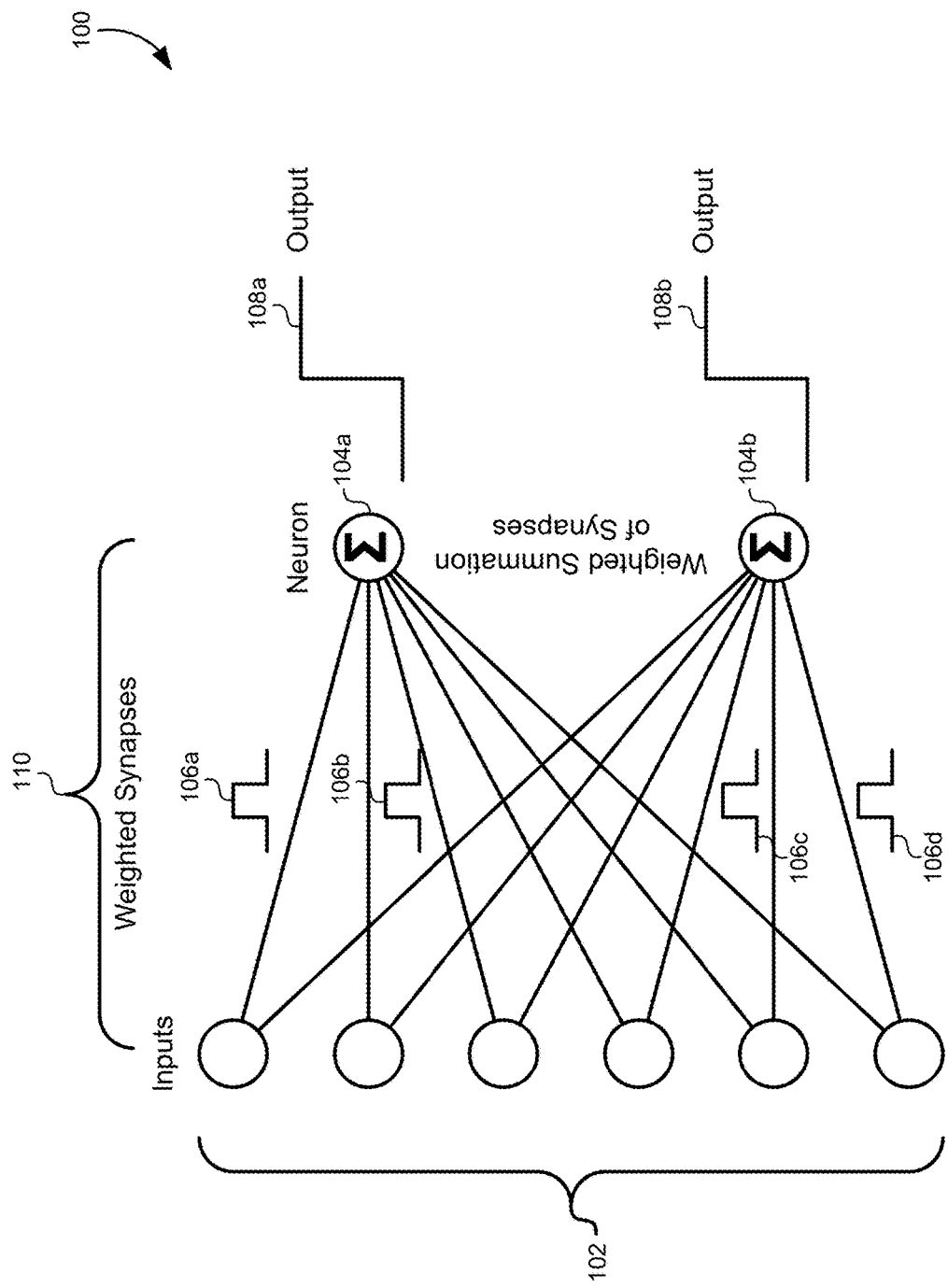
FIG. 1 illustrates a diagram of a portion of a neural network, according to some embodiments.

FIG. 1 illustrates a diagram of a portion of a neural network 100, according to some embodiments. The neural network 100 includes a plurality of inputs 102. The inputs may correspond to an input in a biological system, such as an axon representing a nerve fiber or a long slender projection of a neuron that conducts electrical impulses and acts as a transmission line in the nervous system. For example, the plurality of inputs 102 may represent axons tied to respective photoreceptors used to encode received light in the surrounding environment and transmit an electrical signal representing the received light. The electrical signal may be scaled to represent a magnitude or intensity of a received signal. For example, the plurality of inputs 102 may generate electrical signals that are proportional to an intensity of a received light signal. It should be noted that the use of photoreceptors and image recognition is provided merely by way of example and is not meant to be limiting. Other types of biological and electrical neural networks may be used to receive and process any type of input.

After receiving an input signal at the plurality of inputs 102, each of the plurality of inputs 102 may transmit pulses 106 to one or more neurons 104. The neural network 100 illustrates these pathways between the inputs 102 and the neurons 104 as a plurality of synapses 110. In a biological nervous system, a synapse is a structure that permits a neuron or nerve cell to pass an electrical or chemical signal to another neuron. In the neural network 100, biological synapses may be modeled using synapses 110 that pass a weighted signal between the inputs 102 and the neurons 104 that represents the magnitude of the signal received by the inputs 102. The synapses 110 may also be weighted. For example, a single one of the plurality of inputs 102 may receive an input signal that is weighted differently by the synapses as it is sent to different neurons 104. The weighting of synapses 110 is what allows a neural network to "learn" to recognize specific input patterns and perform specific output tasks. When modeling the synapses 110 in a neural network, they may be represented by a semiconductor device that can receive a plurality of sequential input pulses and generate a corresponding output. For example, each input pulse may cause the synapse output to gradually increase between a logic 0 and a logic 1 level.

The synapses 110 may connect the inputs 102 to one or more neurons 104. These connections may be made in a one-to-many topology between the inputs 102 and the neurons 104. The neurons 104 in the neural network may be modeled after biological neurons, which are electrically excitable cells that communicate with other cells between connecting synapses. After receiving a sufficient number of input impulses, a neuron 104 may "fire" or transition into an excited state. The state may be associated with a sensory response (e.g., touch, sound, light, etc.) and/or motor controls from the brain. To approximate the behavior of a biological neuron, the neurons 102 in the neural network 100 may be implemented using any device that can receive a plurality of input pulses from one or more synapses 110, and after receiving a threshold number of input pulses, cause the outputs 108 of the neurons 104 to toggle between logic 0 and logic 1 states.

FIG. 1 illustrates a greatly simplified view of the neural network 100 in order to describe the various network components clearly. In practice, the neural network 100 may also include one or more hidden layer neurons and synapses between the inputs 102 and the outputs 108. These hidden or intermediate layers allow the task of generating the final outputs 108 to be broken down into sub-steps, each of which may be represented by a corresponding hidden layer of synapses and neurons. For example, the neural network 100 may be configured to distinguish between two different types of images, causing output 108a to fire when recognizing a first type of image, and causing output 108b to fire when recognizing a second type of image. A first hidden layer of neurons and synapses may recognize edges within the images. A second hidden layer of neurons and synapses may recognize shapes forwarded by the edges within the images. Finally, the neurons 104 in the output stage may combine the recognized shapes to distinguish between the first and second image types. Therefore, the neural network 100 may be far more complex in terms of electrical components and connections than may be readily apparent in FIG. 1. Because of the size, complexity, speed requirements, and/or routing difficulties that may accompany complex modern neural networks, there is a great need for circuit elements that can represent biological neurons and synapses in a way that can still allow for efficient layout and fabrication of many devices on a single technology node.

Figure 2:
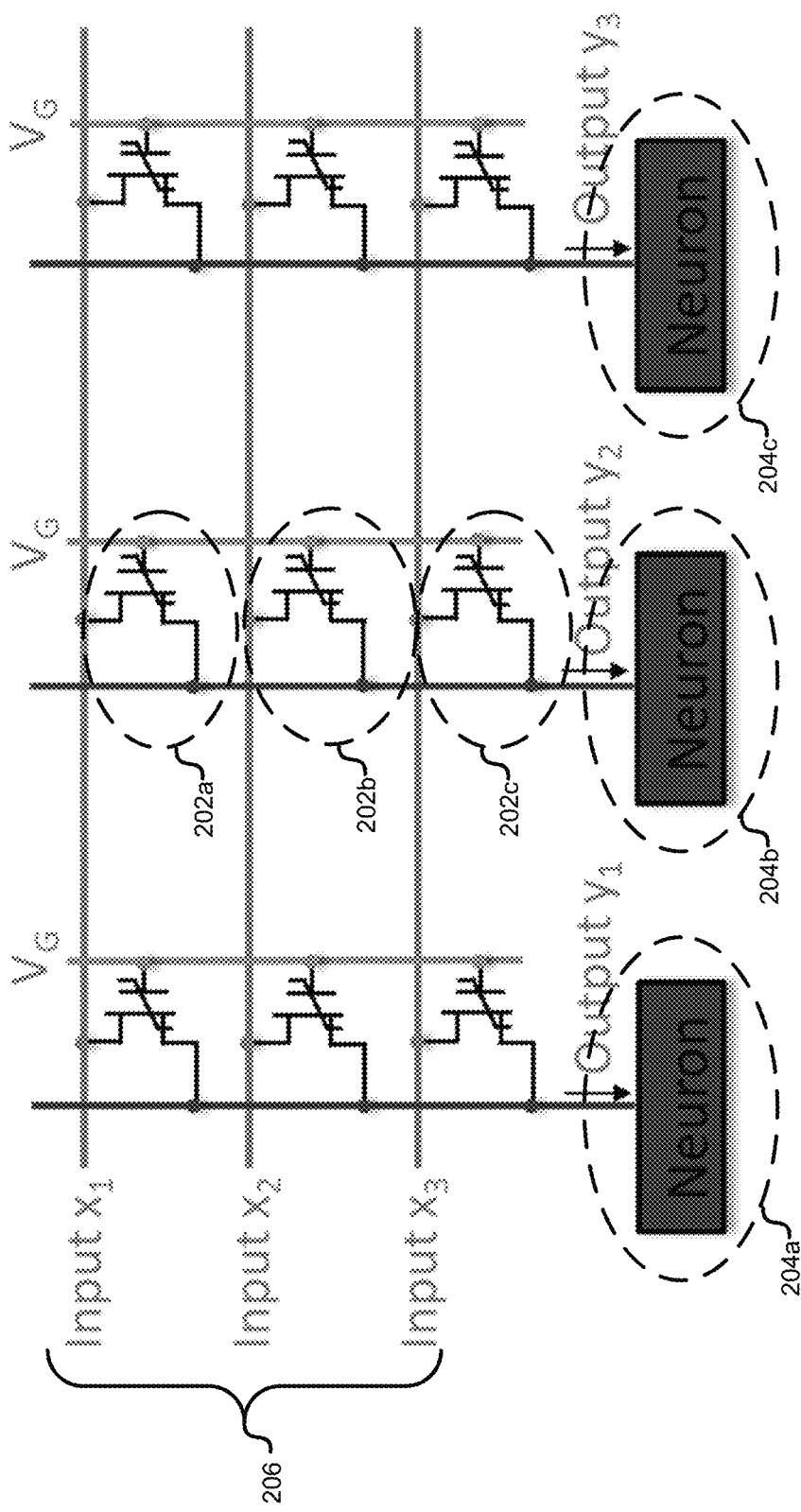
FIG. 2 illustrates a circuit network that implements a neural network, according to some embodiments.

FIG. 2 illustrates a circuit network 200 that implements a neural network, according to some embodiments. The neural network represented by the circuit network 200 may be similar to the neural network 100 in FIG. 1. As was the case for FIG. 1, FIG. 2 is a greatly simplified view of a simple neural network where many connections and/or hidden layers have been omitted for the sake of clearly describing the various circuit components that can be used to represent neurons and synapses. The circuit network 200 includes a plurality of inputs 206 that may correspond to the inputs 102 of FIG. 1. The inputs may be connected to a plurality of devices representing neurons 204 through devices representing synapses. The devices representing the synapses may include transistors 202 that connect the inputs of the neurons 204 to the circuit inputs 206. For the sake of simplicity, many additional circuit elements, such as access transistors have been omitted from FIG. 2. Access transistors may prevent disturbances with a gate connected to the inputs, while the output is connected to the gate of the FeFET. This access transistor together with memory transistor/element constitutes one synaptic element of the pseudo-crossbar array of synapses.

Many different devices may be used to represent synapses in a circuit network. In this circuit network 200, the transistors 202 may be implemented using semiconductor devices that can receive a plurality of input pulses on the $V_G$ line and provide a proportional output to the neurons 204 that are also FeFET transistors (ultimately scaled). Thus, these transistor 202 may be used to model an analog synapse that is controlled by the $V_G$ line. Additionally, the neurons 204 may also be represented by ultimately scaled transistor devices. However, in contrast to the transistors 202 representing the synapses which exhibit an analog, gradual accumulative change of the conductance upon receiving excitation pulses, the transistors representing neurons 204 may be configured to receive a plurality of pulses from the synapses and fire after threshold number of pulses have been received. This basic network of transistor connections between the inputs and the output neurons 204 may be augmented using hidden layers of transistors representing hidden layers of neurons and synapses as described above. When implementing the circuit network 202, it therefore would be beneficial to use semiconductor devices that can implement both the analog behavior of the synapses and the digital behavior of the neurons in a single process.

In various embodiments, many different types of transistors may be used to implement the basic components of a neural network. Modern NAND flash memories include multiple states per cell. For example, a NAND flash memory include 2 (SLC), 4 (MLC), 8 (TLC), or even 16 (QLC) states per cell. While these existing memory devices may functionally be appropriate for a neuromorphic application, they are not ideal. NAND flash memory is slow and the voltages required for their operation are relatively high. With the explosion of data storage and mining, modern circuit networks need low-voltage memory devices that can beat the speeds provided by NAND Flash.

Some embodiments described herein may use a specific type of transistor known as a ferroelectric field-effect transistor (FeFET). A FeFET is a logic/memory transistor that can maintain its logical/memory state even when power is removed. FeFETs are similar to traditional metal oxide silicate (MOS) transistors, except that the logic gate dielectric is replaced with a ferroelectric material, which is a dielectric that "remembers" or stores a polarized dipole as function of the electric fields to which it has been exposed. In a FeFET, a persistent dipole (or so-called "domain") may be formed within the gate dielectric itself, thereby splitting the threshold voltage of the FeFET into two stable states that can represent binary logic states. Because these stable states are persistent, the operation of a FeFET can store state information as is done in a traditional charge-based Flash memory cell. FeFETs also use a relatively small amount of power and are inherently scalable alongside traditional CMOS technologies. The read/write time and the write/erase amplitude for FeFET cells when used as memory devices is also significantly faster and lower, respectively than memories such as NAND Flash memory.

The FeFET and FRAM devices described herein offer many advantages over traditional NAND flash memories. For example, these FeFET and FRAM devices are up to 1000 times faster than comparable NAND flash technologies. The voltage response of these embodiments more precisely matches the ideal response for a neuron and/or a synapse. FeFET and FRAM devices are also field switchable, in that their states can be switched by reversing the electric field instead of driving current through the device, which may be contrasted with other emerging memories such as RRAM, PCM, MRAM, etc., that require driving current through the cell.

Figure 3:
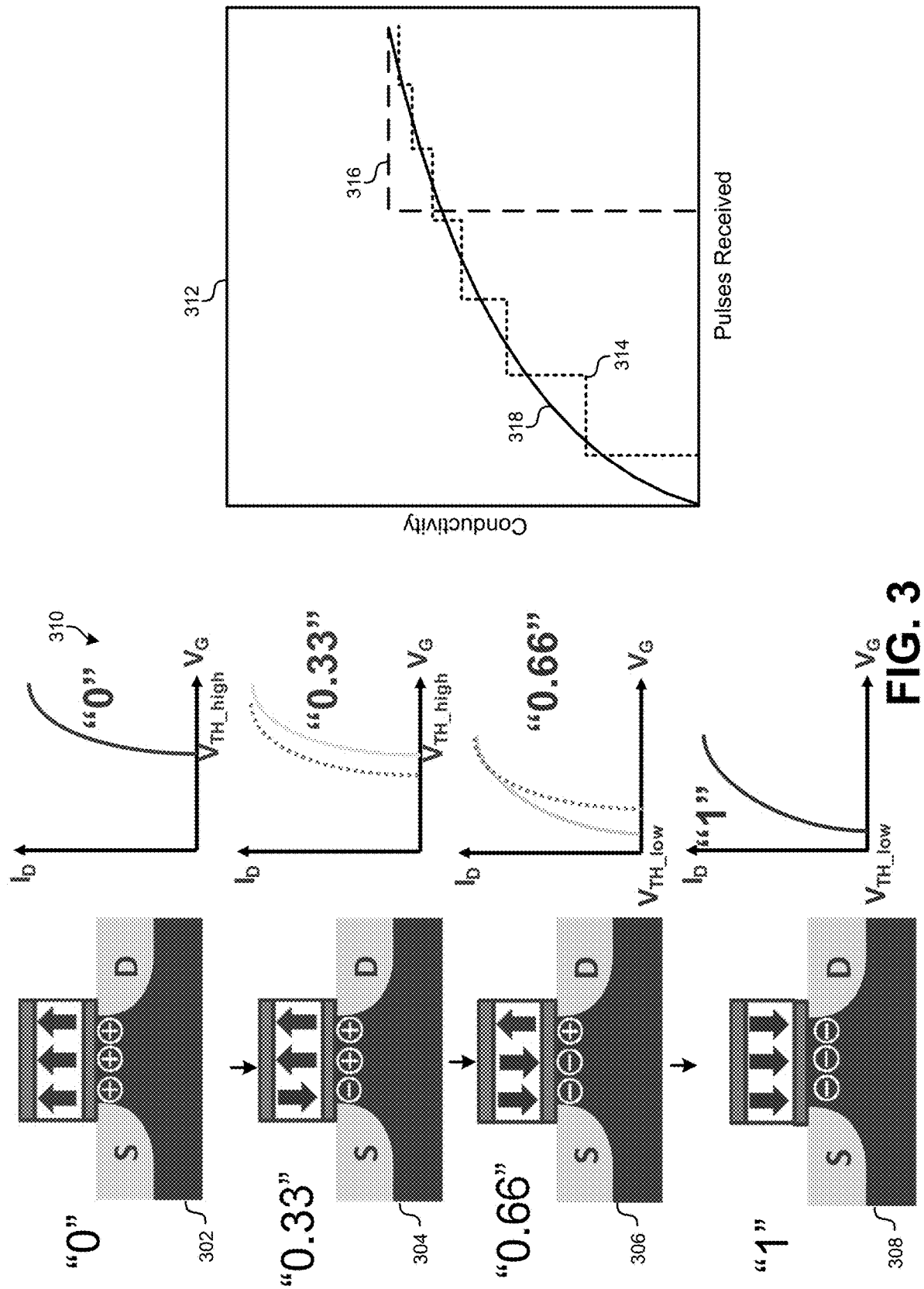
FIG. 3 illustrates a switching cycle for a large area, multistate FeFETs, according to some embodiments.

FIG. 3 illustrates a switching cycle for a large area, multistate FeFETs, according to some embodiments. Ferroelectric materials are materials that can change their state upon application of an external excitation, such as an applied voltage. Ferroelectric materials may include a plurality of physical domains that can be toggled between two stable states. Ferroelectrics may be integrated into a gate of the FeFETs to be used as memory devices. FIG. 3 illustrates one of the features of a FeFET that makes it particularly useful for modeling neurons and synapses in a neural network. Each of the FeFET states 302, 304, 306, 308 on the left-hand side of FIG. 3 represent various states for a FeFET as it gradually transitions between a logic 0 and a logic 1 state. Because of this gradual transition, the large-area FeFET in FIG. 3 may be used to model a synapse. Recall that synaptic behavior gradually transitions between logic states in response to repeated input pulses on the gate electrode. Instead of switching the conductivity of the device in response to a single event, the FeFET may instead gradually switch the conductivity over time as pulses are received from inputs or other neurons-like devices in the neural network.

To model synaptic behavior, a FeFET may be designed to be comparatively larger than similar neuron devices such that the gate electrode can be represented as a plurality of domains, or physical regions that can independently switch in the gate electrode between logic states. Each of these domains is represented in FIG. 3 using the vertical arrows on the gate electrodes of the FeFET in various states 302, 304, 306, 308. The direction of these vertical arrows changes direction to represent the switching behavior of a corresponding domain in the gate. Changing one of the domains in the FeFET may correspond to a change in the structure of the ferroelectric crystal lattice material in the FeFET. Because the crystal lattice itself changes its configuration, the state of the FeFET can persist between input pulses that cause the domains to switch. Furthermore, each domain may be represented with its own hysteresis diagram 310 that switches between stable states. Thus, when a single pulse is received at the gate of the FeFET, one of the domains may switch between stable states, such as transitioning from a logic 0 to a logic 1.

Beginning with the FeFET state 302 at the top of FIG. 3, the FeFET may begin in a logic 0. In this example, the FeFET may be designed to include three distinct domains, although in practice devices may include fewer or many more domains than three. Each of the three vertical arrows pointing up indicates that each of the three domains is currently in the stable logic 0 state. After receiving a first input pulse of opposing polarity compared to one required to reside in logical 0 state, the FeFET may be enter state 304. In state 304, the first domain of the FeFET has switched from a logic 0 to a logic 1. This also is indicated in the hysteresis diagram 310. The received input pulse was sufficient to change a single domain, while leaving the other domains at the stable logic 0 state. Note that some transitions may require multiple pulses to switch a single domain. Next, a second input pulse may be received by the FeFET, causing a second domain of the FeFET to transition to the logic 1 state. This is represented by the second arrow in the gate of the FeFET changing to point downwards in the illustration of state 306. Finally, a third input pulse may be received by the FeFET, causing the final domain to transition to the logic 1 state.

This gradual transition of domains within the FeFET with a plurality of domains may provide the analog-like transition between states that is useful in modeling synaptic behavior. Before receiving any input pulses, state 302 represents a full logic 0 state for the FeFET. Conversely, after receiving a sufficient number of input pulses (e.g., at least three pulses), state 308 represents a full logic 1 state for the FeFET. As each of the domains switch independently, the conductivity of the channel in the FeFET may gradually change between a nonconductive state and a fully conductive state in a corresponding manner. This change in conductivity may cause the output of the synapse to also gradually increase/decrease as positive/negative input pulses are received to switch the corresponding domains.

Graph 312 in FIG. 3 represents the switching behavior of FeFETs with varying numbers of domains. Signal 314 represents a multi-domain FeFET that receives pulses gradually over time. The number of pulses received is represented by the horizontal axis, and the resulting conductivity of the channel of the FeFET is represented by the vertical axis. For the multi-domain FeFET, each received pulse or set of pulses results in a step increase in the conductivity of the channel as independent domains switch. The FeFET represented by signal 314 may include at least six domains. Curve 318 represents an idealized response that can be approximated by increasing the number of domains in the FeFET. For example, as the number of domains in the FeFET increases, the steps of signal 314 may become smaller, and the overall shape of signal 314 may begin to approach the shape of curve 318. Graph 312 thus illustrates how a multi-domain FeFET can be used to model the analog output of a synapse that is proportionately responsive to received input pulses.

In contrast to the synaptic behavior illustrated by the multi-domain FeFET in FIG. 3, a simpler, smaller FeFET device may also be used to represent neuron behavior in a neural network. Although not shown explicitly in FIG. 3, a FeFET having only a single domain would may have only a single accumulative switching event. Signal 316 of graph 312 shows how a single-domain FeFET may respond to a plurality received pulses. Instead of switching individual domains as pulses are received, the neuron-like FeFET having only a single domain may exhibit a single switching event between stable logic states. For example, when a sufficient number of pulses have been received from larger FeFETs representing synapses, a smaller FeFET representing a neuron can "fire," or transition between stable states. Therefore, not only is the FeFET useful for representing synaptic behavior, it can also be used to represent neuron behavior by limiting the number of domains in the device.

Figure 4:
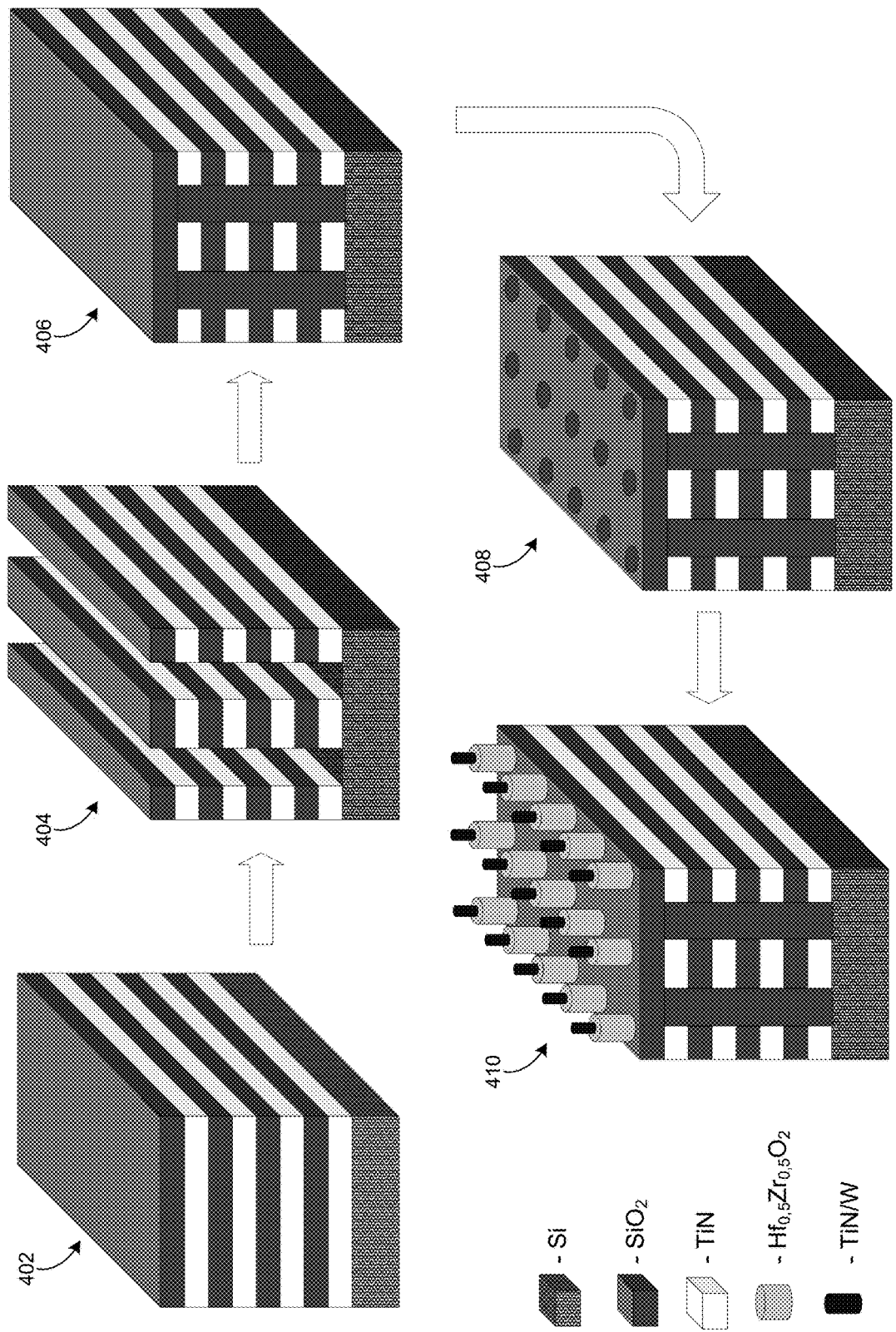
FIG. 4 illustrates a simplified method of fabricating an array of vertical memory cells, according to some embodiments.

FIG. 4 illustrates a simplified method of fabricating an array of vertical memory cells, according to some embodiments. The process depicted in FIG. 4 has been used to fabricate NAND-flash memory, and may be altered herein to allow for the fabrication fabricate a variety of different types of RAM cells, including ferroelectric RAM (FRAM) cells, resistive-RAM (RRAM) memory cells, and other types of memory devices described in detail below. At step 402, alternating layers of an isolator and a metal may be deposited on top of a silicon substrate. In this example, alternating layers of a metal such as TiN may be deposited between alternating layers of silicon dioxide ($SiO_2$). These metal layers may include other materials, such as W as described below in this disclosure. This deposition may be accomplished using Physical Vapor Deposition (PVD), Plasma-Advanced Chemical Vapor Deposition (PECVD), Atomic Layer Deposition (ALD), or other similar processes.

At step 404, trenches may be etched into the alternating layers of metal and isolator. For example, a dry etch may be used to split the plane electrode and form a plurality of channels in the alternating layers of metal and isolator. At step 406, the trenches that were etched in step 404 may be filled by isolator, such as $SiO_2$. These trenches may isolate the different layers of metal and isolator into a plurality of horizontal rows. At step 408, a plurality of holes may be etched through the alternating layers of isolator and metal. The holes may be aligned such that rows of holes may be formed in each of the horizontal rows of isolator and metal layers left between the $SiO_2$-filled trenches. At step 410, the memory elements may be formed by filling the holes with a material, such as a dielectric (e.g., hafnium-based materials) along with a metal electrode in the center. The center electrode may be formed from a metal, such as TiN, tungsten (W), Ir, Ru, TaN, or other similar materials. Although not illustrated explicitly in FIG. 4, the method may include an additional step that etches a "staircase" into the device. The staircase exposes layers of material in each "step" of the staircase. A cross-section of the exposed staircase is illustrated below in a number of different figures, such as FIG. 8.

The hafnium-based material acts as a dielectric and an active layer, and a metal-isolator-metal capacitor is formed in the lateral direction in each layer. A first electrode for each capacitive ferroelectric memory element may be formed by each of the metal electrodes in the center of the hafnium-filled holes. A second electrode for each memory element may be formed by the metal (e.g., each TiN layer) running horizontally between each of the isolator-filled trenches. Note that this same process may be used to form a NAND Flash-like memory by substituting the center electrode for a silicon material to form a transistor instead of a capacitive element.

Figure 5:
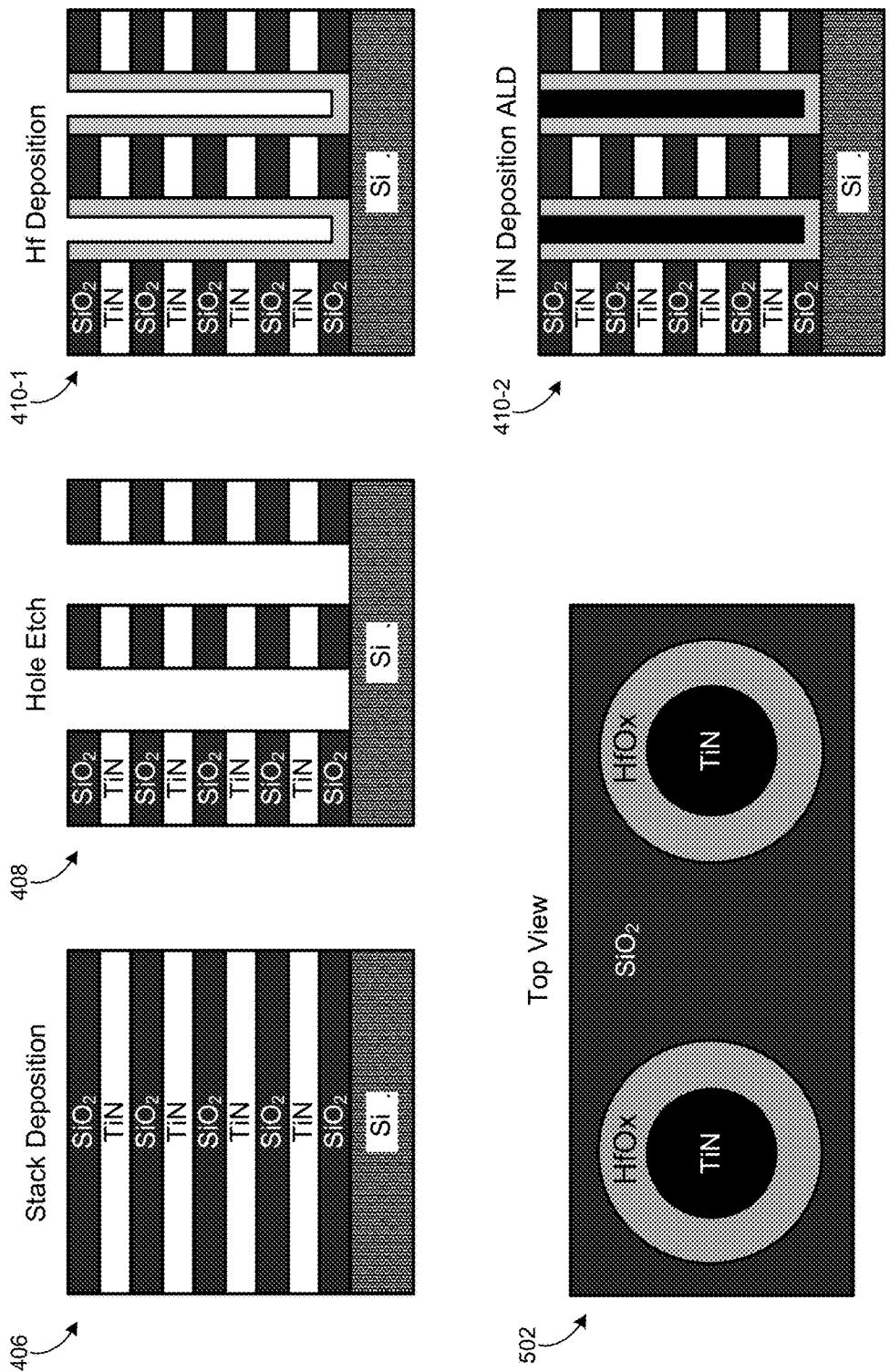
FIG. 5 illustrates a cross-sectional view of the memory fabrication process described in FIG. 4 above, according to some embodiments.

FIG. 5 illustrates a cross-sectional view of the memory fabrication process described in FIG. 4 above, according to some embodiments. The stack deposition illustrated in the upper left-hand corner corresponds to step 406 in FIG. 5. This shows a side view of one of the rows of alternating metal and isolator layers. At step 408, the holes may be etched in one of the rows of alternating metal and isolator layers. Because this is a cross-sectional view, holes in step 408 may appear to extend all the way through each of the alternating metal and isolator layers. However, it should be understood that the isolator layers between trenches as well as portions of the alternating metal and isolator layers would still exist on either side of each of the holes.

At step 410-1, each of the holes may first be filled with a hafnium-based ferroelectric material using a deposition process. Afterwards, a metal may be deposited in the center of each of the hafnium holes to form a metal electrode. For example, vertical electrodes of TiN may be formed using an Atomic Layer Deposition (ALD) process. FIG. 5 also illustrates a top view 502 of a portion of one row of memory elements. The hafnium oxide dielectric and titanium nitride electrodes may extend out of FIG. 5, and additional memory strings with multiple tiers may be formed along the rest of the row that is not specifically illustrated in FIG. 5.

Figure 6:
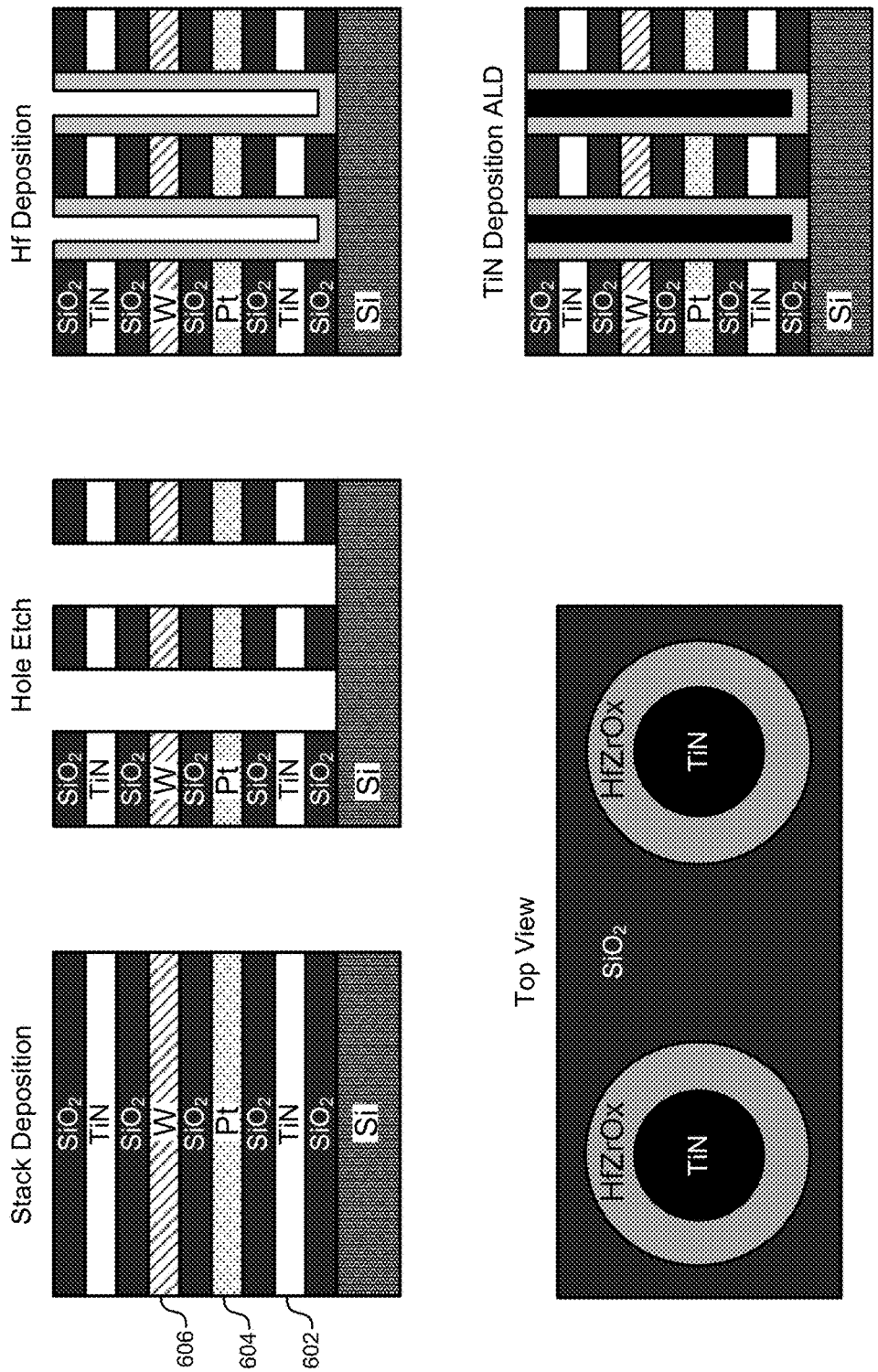
FIG. 6 illustrates an alternate process for fabricating an array of memory elements, according to some embodiments.

FIG. 6 illustrates an alternate process for fabricating an array of memory elements, according to some embodiments. As described below, the following fabrication process may form an ferroelectric vertical multi-level cell (V-MLC) memory array of individual memory elements capable of storing more than single bits of information. Specifically, these embodiments use a series of different types of metal for each metal layer in the alternating layers of metal and isolator described above. Each of the metal layers may be associated with a different work function, and the different work function may cause a shift in the hysteresis of the voltage/current response of the memory element to form a multi-state memory. Example of how shifting the hysteresis curve for each individual metal in the memory element may form a multi-state memory are described in greater detail below. These multiple states are created by the work function difference between horizontal electrode metals and the metal used for the vertical electrode in the memory array.

The embodiment described above in FIGS. 4-5 used alternating layers of $SiO_2$ and TiN to form individual memory elements. In contrast, the embodiment of FIG. 6 uses different metals for each of the alternating layers of metal between the isolator layers. For example, a single memory device may use a first metal layer 602 having a first work function (e.g., TiN, having a work function of approximately 4.5 eV) followed by an isolator layer or an inter-dielectric layer (IDL) (e.g., $SiO_2$). The memory device may then use a second metal layer 604 having a second work function that is different from the first work function (e.g., Pt, having a work function of approximately 5.6 eV) followed by another isolator layer. The memory device may then use a third metal layer 606 having a third work function that is different from both the first work function and the second work function (e.g., W, having a work function of approximately 5.1 eV). Each of these three different metals with different work functions may generate the different internal biases between the outer and inner electrode, which may cause the ferroelectric to switch at different levels of applied voltages. As each of these metals individually switch, the overall state of the memory element may gradually progress through a number of intermediate states. Each of these metal layers 602, 604, 606 may have a thickness of between approximately 3 nm and approximately 50 nm.

It should be emphasized that using three different metals in FIG. 6 is provided merely by way of example and is not meant to be limiting. Other embodiments may use more or fewer metal layers for a single device. For example, some embodiments may use two layers, four layers, six layers, eight layers, and so forth, each using different metals and each having different work functions. Also note that the rest of the fabrication process for the memory array may be the same as described above. For example, holes may be etched, hafnium material may be deposited in the holes, and the holes may be filled with a metal electrode, such as TiN or any other similar materials.

Figure 7:
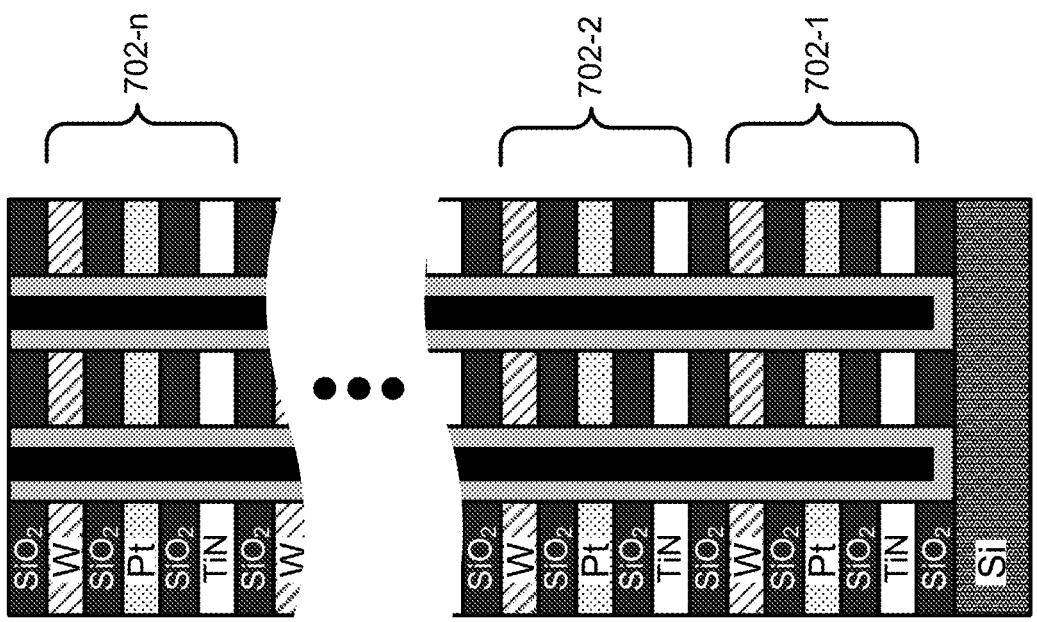
FIG. 7 illustrates how multiple devices having different internal metal layers may be stacked vertically within a multi-tier memory string of the memory array, according to some embodiments.

FIG. 7 illustrates how multiple devices having different internal metal layers may be stacked vertically within a multi-tier memory string of the memory array, according to some embodiments. Instead of depositing layers such that every pair of metal and isolator layers forms a single device, a device may be formed from multiple different metal layers separated by isolator layers as described above. For example, a plurality of devices 702 may be stacked vertically using the layered fabrication approach described above. A first device 702-1 may include alternating layers of TiN, $SiO_2$, Pt, $SiO_2$, W, $SiO_2$, and/or alloys such TiAlN where the Al content may be tuned to obtain the desired work function, and so forth. A second device 702-2 may include alternating layers of the same materials and/or other materials. The metal layers in the first device 702-1 may be the same as the metal layers in the second device 702-2.

Alternatively, other devices in the vertical stack 702-*n* may use different numbers and/or different types of metal layers.

Figure 8:
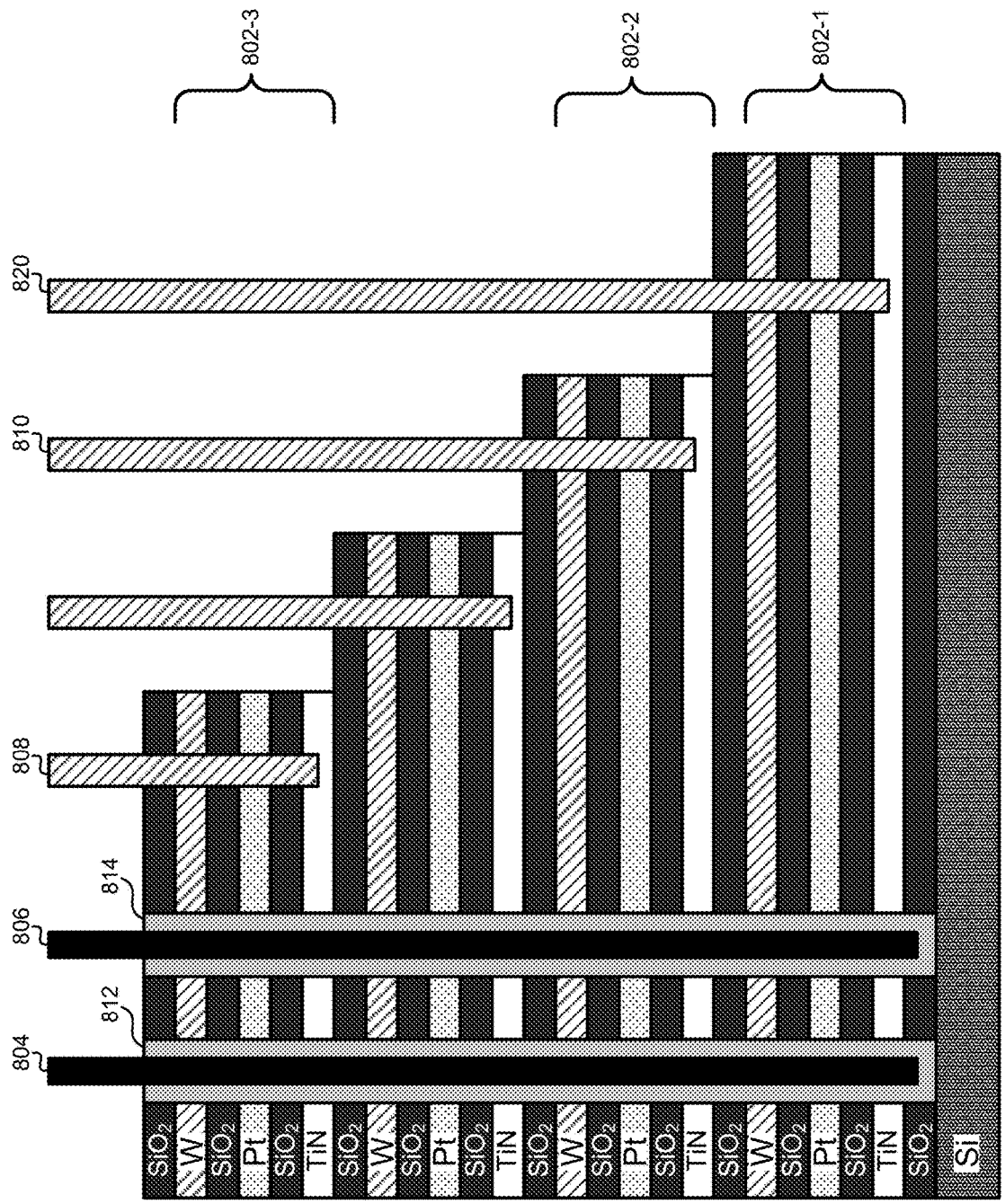
FIG. 8 illustrates a side, staircase-view of the vertical memory string stack with contact to discrete cells, according to some embodiments.

FIG. 8 illustrates a side, staircase view of the vertical memory string stack with contact to discrete cells, according to some embodiments. This side view illustrates two of the vertical holes that are filled with a ferroelectric material 812, 814, such as hafnium and metal electrodes 804, 806. Each of the metal electrodes 804, 806 may form a first (inner) electrode for a memory element. The other, lateral electrodes for each memory element of the string may be individually contacted through the metal contacts which fill the holes that are etched to an appropriate depth in the staircase such that the other electrodes each contact the individual metal layers for each memory element. In this example, the multiple metal and isolator layers for each memory element may be fabricated using a staircase etch process as depicted in FIG. 8. This process exposes a vertical surface for each device in a staircase pattern such that the second electrode for each device does not contact the metal layers for other devices above the current device in the vertical stack.

For example, a first memory device 802-3 may be formed using electrode 806 as a first, inner electrode and using contact 808 as a second electrode that reaches each of the lateral electrodes (i.e., second electrodes) in the device. In this example, the lateral/second electrodes may be formed using any metals, such as W, Pt, TiN, or alloys such TiAlN where the Al content may be tuned to obtain the desired metal work function. The contact 808 may be formed by first etching a vertical hole into the metal/isolator layers that are part of the first memory device 802-3. For example, as depicted in FIG. 8, a hole may be etched such that it penetrates down to the third metal layer (TiN) after proceeding through the first and second metal layers (e.g., W and Pt) and the intervening isolator layers (e.g., $SiO_2$). The depth of the etch may be controlled by the time of the etching process. For example, the process may be calibrated such that the etch penetrates a predetermined distance per time unit, and the time of the etch may thus be controlled to determine the depth of the etch. When the proper depth is reached, the resulting hole can be filled with a second metal to form the contact 808. In this example, W is used as a material for the second electrode 808, but any other metal may be used in other embodiments.

The first memory device 802-3 may be comprised of the multiple separate metal layers (e.g., TiN, Pt, W, or alloys such TiAlN) with intervening isolator layers. The contact 808 may connect to each of the separate lateral metal layers in the first memory device 802-3 to reach to second lateral electrode(s) through the contact 808. Individual regions may be created in the first memory device 802-3 for each of the metal-isolator-metal junctions through the contact 808 to the lateral electrode(s) formed by each of the metal layers, through the hafnium material 814, and finally through the first inner electrode 806 (or electrode 804 for a different device). Because each of the metal layers in the first memory device 802-3 is fabricated using a different material, each of the metal layers may be associated with a different work function. Different voltages applied across the first electrode 806 and the contact 808 through lateral electrode metal layers may cause the different regions associated with the different metal layers to switch at different input voltages. This allows the first memory device 802-3 to step through multiple states in a single device. The different work functions allow the three different capacitors formed between the first electrode 806 and the lateral electrode metal layers through the contact 808 to be programmed simultaneously with different switching characteristics.

Figure 9:
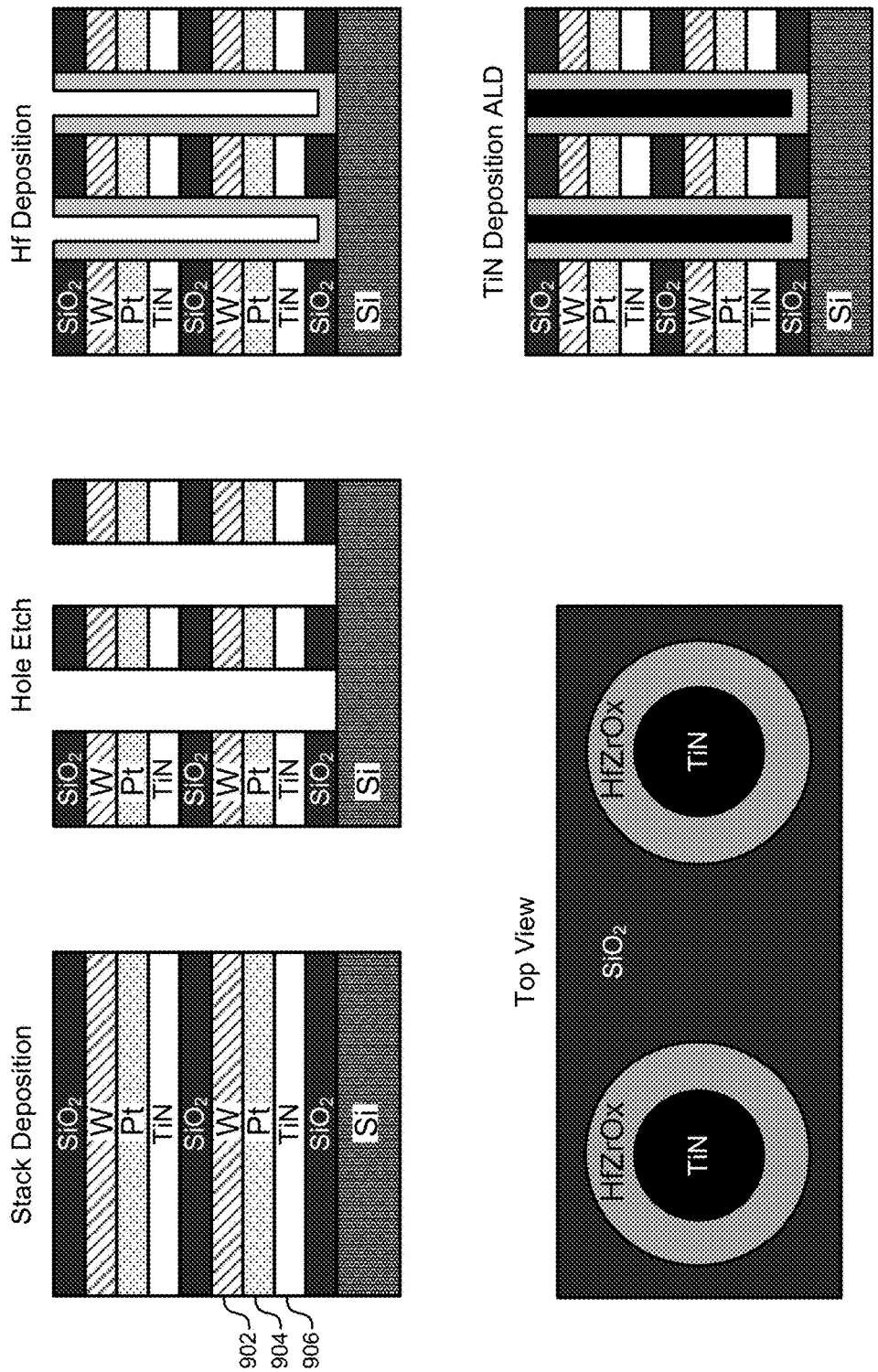
FIG. 9 illustrates vertical memory elements that may be formed without requiring, inter-layer dielectric layers that separate different metal layers, according to some embodiments.

FIG. 9 illustrates vertical memory elements that may be formed without requiring, inter-layer dielectric layers that separate different metal layers, according to some embodiments. These embodiments are similar to those illustrated above in FIG. 6, the exception being that the isolating layers between the metal layers have been removed from the fabrication process. A single memory/synaptic device may include any number of different internal metal layers (e.g., TiN, Pt, W, alloys such TiAlN, etc.). These layers may be deposited using the fabrication processes described above directly on top of each other in the vertical stack. In the example of FIG. 9, each memory device comprises three internal metal layers 902, 904, 906 that form lateral electrodes. After depositing a first internal metal layer 906 comprised of TiN, a second metal layer 904 comprised of Pt may be deposited directly on top of the first metal layer 906. Likewise, a third metal layer 902 comprised of W may be deposited directly on top of the second metal layer 904.

To separate one device tier from another in the vertical stack, or "string," a layer of an isolator material may be deposited between each of the stacks of internal metal layers forming the lateral electrodes between the devices to separate the different devices. For example, an isolator layer comprised of $SiO_2$ may be deposited on top of the third metal layer 902 in the device of FIG. 9. After the isolator layer has been deposited, the process for depositing multiple metal layers forming the lateral electrodes may be repeated to form another memory device on top of the existing memory device. Although the example in FIG. 9 shows only two memory devices in the vertical stack, devices fabricated in practice may have many more memory devices layered vertically that are not shown explicitly in this example.

The rest of the fabrication process may proceed as described above. Specifically, holes may be etched through each of the metal and isolator layers in each of the isolator-separated rows of material. A ferroelectric material, such as doped HfOx or a HfZrOx mixture may be deposited such that it lines each of the holes (e.g., $HfZrO_x$), and the remaining area inside of each of the holes may be filled by depositing an inner metal electrode (e.g. TiN). Again, although the example of FIG. 9 shows only two holes, devices fabricated in practice may have many holes in each of the rows that are not shown explicitly in this example. Additionally, the types of metal and the hafnium material used in FIG. 9 are provided merely by way of example and are not meant to be limiting. Other dielectric and metal materials may be used without limitation.

Figure 10:
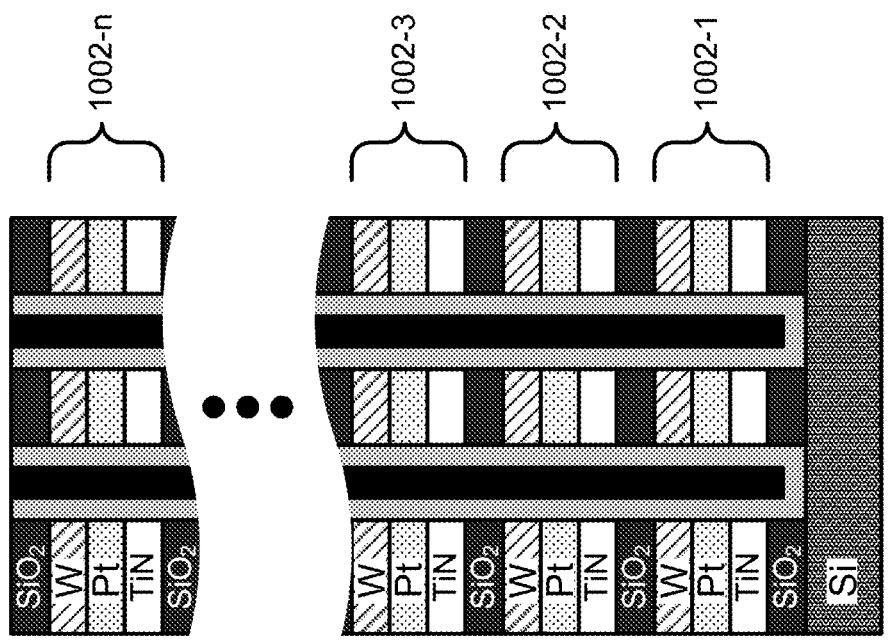
FIG. 10 illustrates a vertical stack of a multi-tier string of a memory array without internal dielectric (isolating) layers, according to some embodiments.

FIG. 10 illustrates a vertical stack of a multi-tier string of a memory array without internal dielectric (isolating) layers, according to some embodiments. In comparison to the example of FIG. 7, this example provides the advantage of increasing the vertical density of memory devices. By limiting n internal isolator layers for n−1 internal metal layers, a number of memory element tiers 1002 in a vertical stack string may be increased significantly. For example, three vertical memory elements 1002-1, 1002-2, 1002-3 may be fabricated using only 12 layers (i.e., three internal metal layers and one isolator layer for each device 1002) in contrast, only two vertical memory elements 702-1, 702-2 in FIG. 7 require the same number of 12 layers (i.e., three internal metal layers and three isolator layers for each device 702). This effectively allows the vertical stack of memory devices to be much more compact, with more memory cells provided for the same vertical thickness. Note that this realization may not allow individual access to the lateral metal electrode layers individually through the vertical contact hole, and thus may be best suited for use as a synaptic element for precise potentiation and depression tuning.

Figure 11:
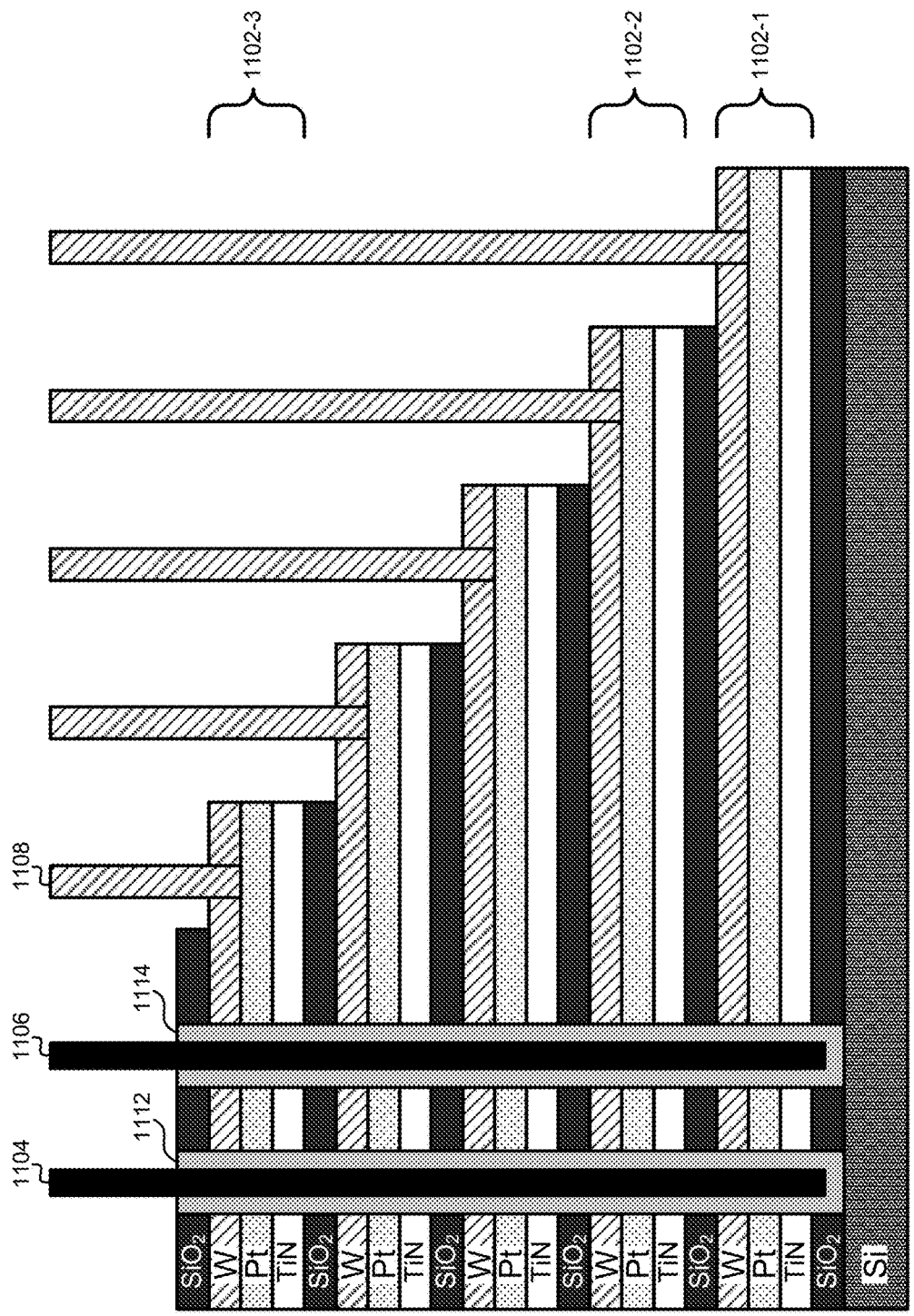
FIG. 11 illustrates a side, staircase view of a vertical memory element stack without intervening isolator layers, according to some embodiments.

FIG. 11 illustrates a side, staircase view of a vertical memory element stack, shown in FIG. 9, without intervening isolator layers, according to some embodiments. This side view illustrates two of the vertical holes that are filled with ferroelectric materials 1112, 1114 and inner metal electrodes 1104, 1106. Each of the metal electrodes 1104, 1106 may form a first electrode for a memory element. The second, lateral electrodes for each memory element may be individually contacted by depositing a contact metal in holes that are etched to an appropriate depth such that resulting contact 1108 interfaces with the individual lateral metal layers for a single memory element. In this example, the multiple metal layers and single isolator layer for each memory element may be fabricated using a staircase etch process as depicted in FIG. 11. This process exposes a vertical surface for each device in a staircase pattern such that the second electrode for each device does not contact the metal layers for other devices above the current device in the vertical stack.

For example, a first memory device 1102-3 may be formed using inner electrode 1106 as a first electrode and using contact 1108 which penetrates a series of lateral electrode materials that constitute a second electrode. The vertical contact 1108 interfacing with the lateral electrode materials may be formed by first etching a vertical hole in the metal layers that are part of the first memory device 1102-3. For example, as depicted in FIG. 11, a hole may be etched such that it penetrates down to any of the internal, lateral electrode metal layers, such as the first W layer. The depth of the etch may be controlled by the time the etching process is allowed to proceed. For example, the process may be calibrated such that the etch penetrates a predetermined distance per time unit, and the time of the etch may thus be controlled to determine the depth of the etch. When the corresponding amount of time has passed, the proper depth may be reached, and the resulting hole may be filled with a contact metal such that the contact 1108 reaches the second lateral metal electrode composed of the multiple metal layers. In this example, W is used as a material for the vertical contact 808, but any other metal may be used in other embodiments.

The first memory device 1102-3 may be comprised of the multiple separate metal layers (e.g., TiN, Pt, W, or alloys such TiAlN, etc.) without intervening isolator layers. The vertical contact 1108 to lateral second electrode layer(s) may connect to each of these lateral separate electrode metal layers in the first memory device 1102-3. Individual regions may be created in the first memory device 1102-3 for each of the metal-isolator-metal junctions between the second lateral electrodes (i.e. TiN, Pt, W, or alloys such TiAlN) through the vertical contact 1108 continued through each of the metal layers, through the ferroelectric material 1114, and to the first electrode 1104. Because each of the metal layers in the first memory device 1102-3 is fabricated using a different material, each of the metal layers may be associated with a different work function. Different voltages applied across the first electrode 1106 and the vertical contact 1108 to second lateral electrode layers may cause the different regions associated with the different metal layers to switch at different input voltages. This allows the first memory device 1102-3 to step through multiple memory states in a single device. The different work functions allow the three different capacitors formed between the first inner, vertical electrode 1106 and the second lateral electrode layers, contacted through the vertical contact 1108, to be programmed simultaneously with different switching characteristics.

Figure 12A:
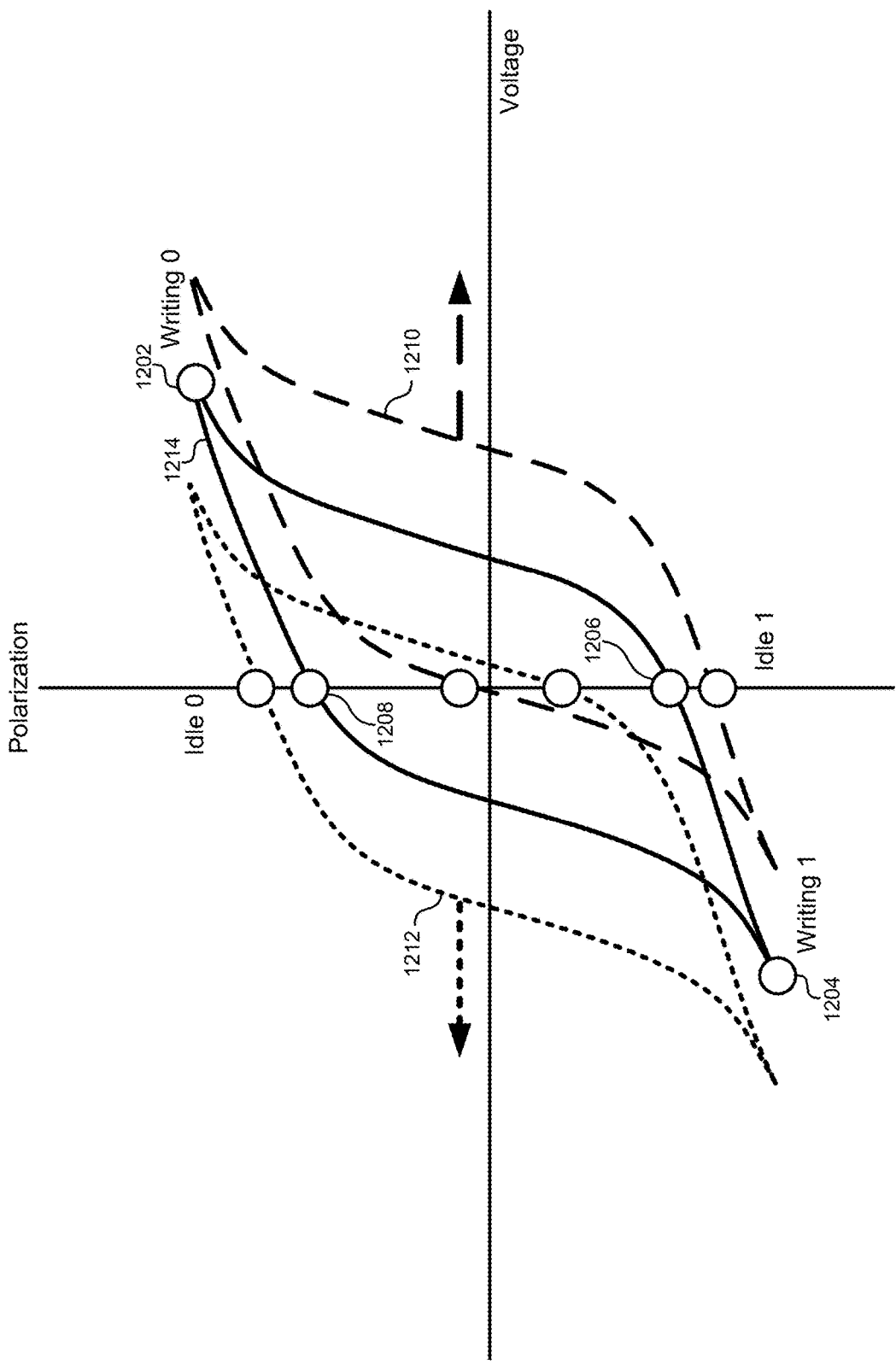
FIG. 12A illustrates how the different metal layers can be used for internal bias generation to shift the hysteresis curve for the memory element, according to some embodiments.

FIG. 12A illustrates how the different metal layers can be used for internal bias generation to shift the hysteresis curve for the memory element, according to some embodiments. As described above, the different metal layers inside the device may cause different work functions to be associated with the different electrical pathways between the electrodes. The different work functions may generate an internal bias that can shift the normal hysteresis response curve of the memory device. FIG. 12A shows how the shifted internal bias can create multiple states in a polarization-voltage loop.

The hysteresis curve 1214 for a single metal is illustrated along with the transitions between two binary 0 and 1 states for that metal. For example, to write a logic 0, the voltage may be increased to state 1202, then allowed to idle at state 1208 where very little current passes through the device while maintaining the logic 0. Similarly, a logic 1 may be written by lowering the voltage to state 1204, then allowing the device to idle at state 1206 without driving current through the device. The hysteresis of the curve allows both the logic 0 and the logic 1 states to be maintained without current.

When multiple metals are added to the same device, the effect of each of these metals is to shift the hysteresis curve to the left or to the right. As the work function differential between the metals is added to the memory device, this generates an internal voltage bias that shifts the hysteresis curve. As the curve is shifted, multiple states are created such that the memory is able to represent more than the basic logic 0 and logic 1 states. FIG. 12 illustrates three hysteresis loops 1210, 1212, 1214, each representing a different metal layer as a lateral electrode in the memory. Each of the intercepts on the Y-axis represents a stable state into which the cell can be set. In this example, there are six intercepts which translate into six different memory states to be used in, for example, a 3-bit synapse.

FIG. 12B illustrates an aggregation of the effect of the multiple hysteresis curves illustrated in FIG. 12A, according to some embodiments. The multiple hysteresis curves 1212, 1214, 1210 may be combined or summed together to form a single curve 1220. The resulting curve 1220 may include a number of voltages 1222, 1224, 1226 that may be referred to as coercive voltages. Graphically, the coercive voltages may be shown as inflection points in the curve 1220. Although only three of the coercive voltages 1222, 1224, 1226 are called out specifically in this discussion, it should be readily apparent that more coercive voltages are present in FIG. 1220. These coercive voltages may be key for transistor-based memory operation. For example, a memory window may be directly proportional to the number of coercive voltages. The more coercive voltages present in the curve 1220, the more threshold voltages a corresponding ferroelectric transistor may have. For capacitor-based realizations, the relevant feature is instead the remnant polarization. The device illustrated in FIG. 12 B may have multiple remnant polarizations, depending on the extent to which the device is switched (i.e., how large a voltage is applied to the device).

Figure 13:
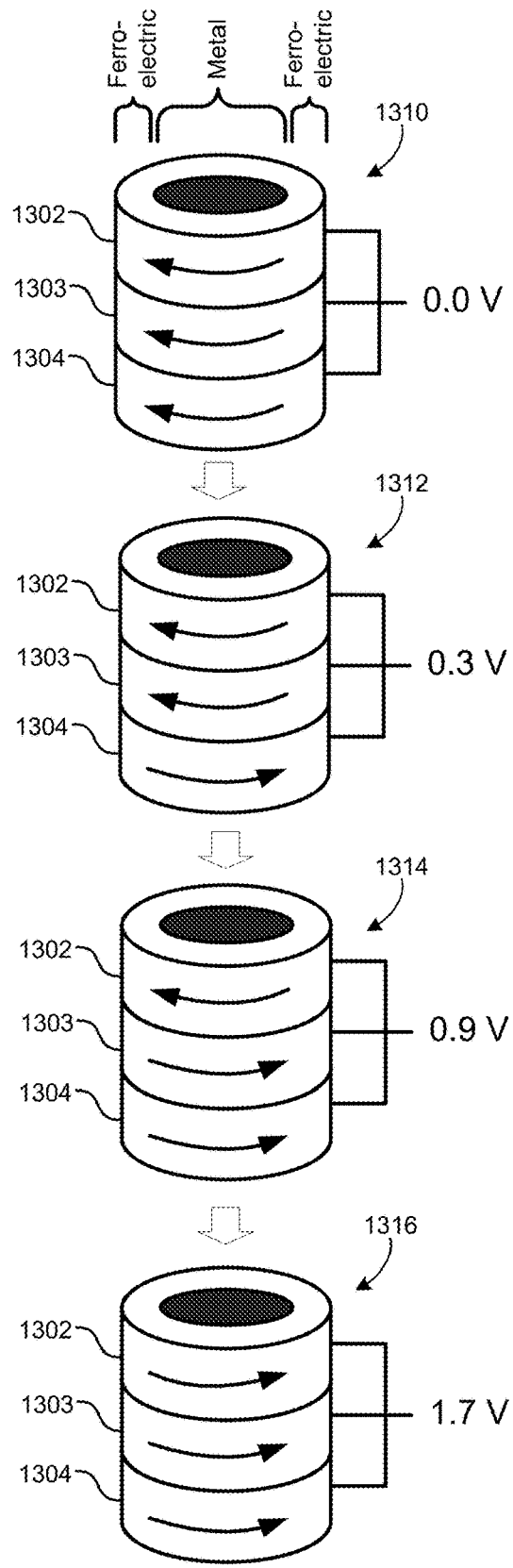
FIG. 13 illustrates how different switching regions within the dielectric correspond to internal biases generated by the surrounding metals, according to some embodiments.

FIG. 13 illustrates how different switching regions within the ferroelectric layer under the correspond to the surrounding metals can be polarized, according to some embodiments. Continuing with the examples above, a vertical memory cell having at least three different metals is depicted. Although the metals themselves are not illustrated in FIG. 13, the high-k ferroelectric material (e.g. HfOx) illustrates the different switching regions that are formed therein by the different metals having different work functions. At step 310, three different lateral regions 1302, 1303, 1304 are shown as being connected to the same second lateral electrode via vertical contact 808. The second electrode may currently be set to 0.0 V between the first electrode (e.g., TiN) and the second electrode. Consequently, each of the electric fields in the different regions 1302, 1303, 1304 are oriented in the same direction.

At step 1312, a 0.3 V signal has been applied to the second electrode. This voltage is sufficient to overcome the work function of the bottom metal in the vertical stack. Region 1304 may be directly adjacent to this metal, and may consequently be switched independent of the other two regions 1302, 1303. While the uniform polarity of the regions 1302, 1303, 1304 at step 1310 may represent a first state for the memory device, the single switched region 1304 at step 1312 may represent a second state for the memory device.

At step 1314, a 0.9 V signal has been applied to the second electrode. This voltage may be sufficient to overcome the work function of both the bottom metal and the middle metal in the vertical stack. Region 1304 may remain switched, as it is adjacent to the first metal. Region 1303 may be adjacent to the middle metal. As the voltage is increased, region 1303 may switch such that its polarity matches that of region 1304. This may represent a third state for the memory device.

Similarly, at step 1306, a 1.7 V signal may be applied to the second electrode. This voltage may be sufficient to overcome the work functions of all of the metals in the device. This may therefore cause all of the regions 1302, 1303, 1304 to switch polarity. This may represent a fourth state for the memory device. Note that the use of three different dielectric regions is used in FIG. 13 only by way of example and is not meant to be limiting. More or fewer metals may be added in the stack to generate more or fewer states in the memory device.

Figure 14:
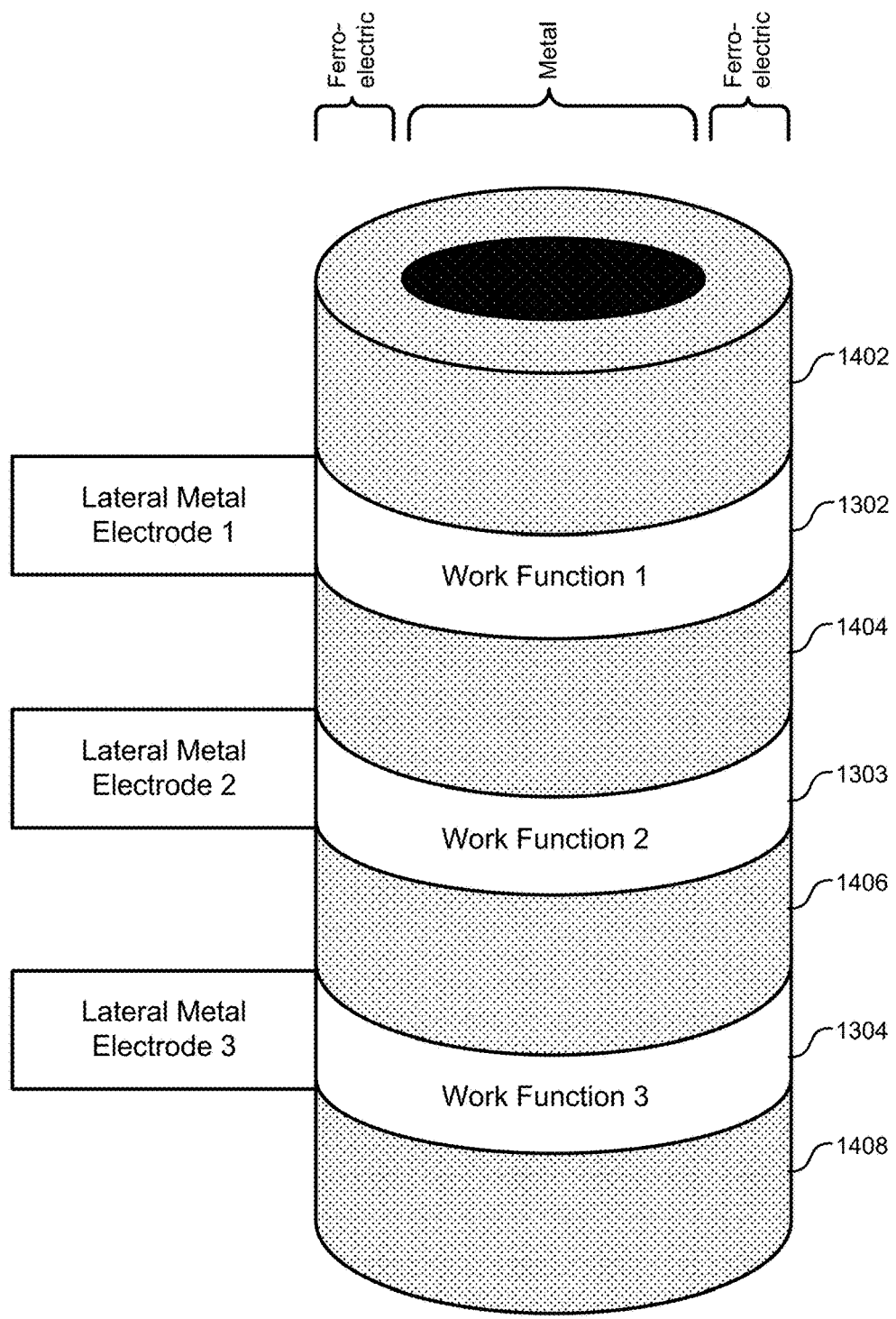
FIG. 14 illustrates the different regions in the dielectric with separating isolator layers, according to some embodiments.

FIG. 14 illustrates the different regions of the memory cell with separating isolator layers, according to some embodiments. When each of the metal layers are separated by isolator layers, the switching regions in the ferroelectric may also be separated in a similar fashion. In this example, the switching regions 1302, 1303, 1304 under the electrode corresponding to the surrounding different types of metals are separated by isolator regions 1402, 1404, 1406, 1408 corresponding to the isolator material between the metal layers. The advantage of using isolator layers is that the switching regions are isolated with the dielectric, which in turn prevents disturbances between the regions of the cell. Some materials, voltages, and applications may cause the switching regions of one metal to affect the switching regions of other metals when they are adjacent. While adding isolator layers does add additional thickness to the vertical stack, it also provides a more stable, discretized switching environment for the memory device.

Figure 15:
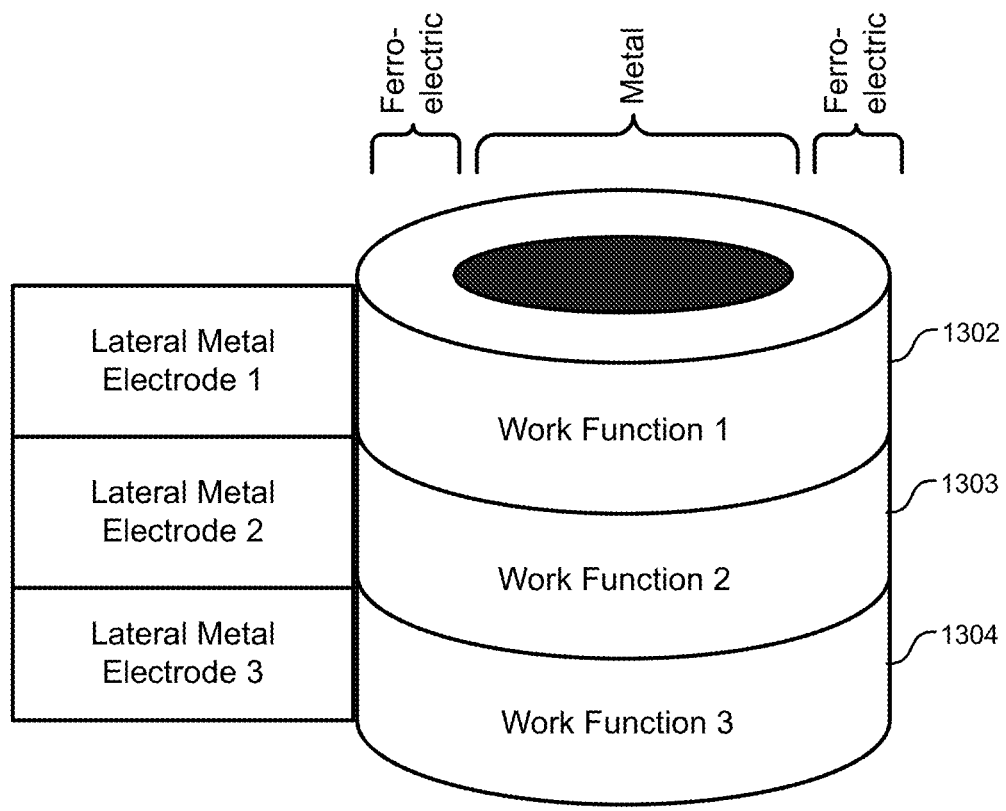
FIG. 15 illustrates the different regions in the dielectric without separating isolator layers, according to some embodiments.

FIG. 15 illustrates the different regions in the memory cell without separating isolator layers, according to some embodiments. When voltages, materials, and applications do not cause interference between the various switching regions 1302, 1303, 1304 in the dielectric material, this more compact arrangement may be used. This may be used to increase the memory device density within the memory string (i.e., vertical stack), to decrease the thickness of the vertical memory stack, and/or to decrease the fabrication time and etching complexity for integration of the memory stack.

Figure 16:
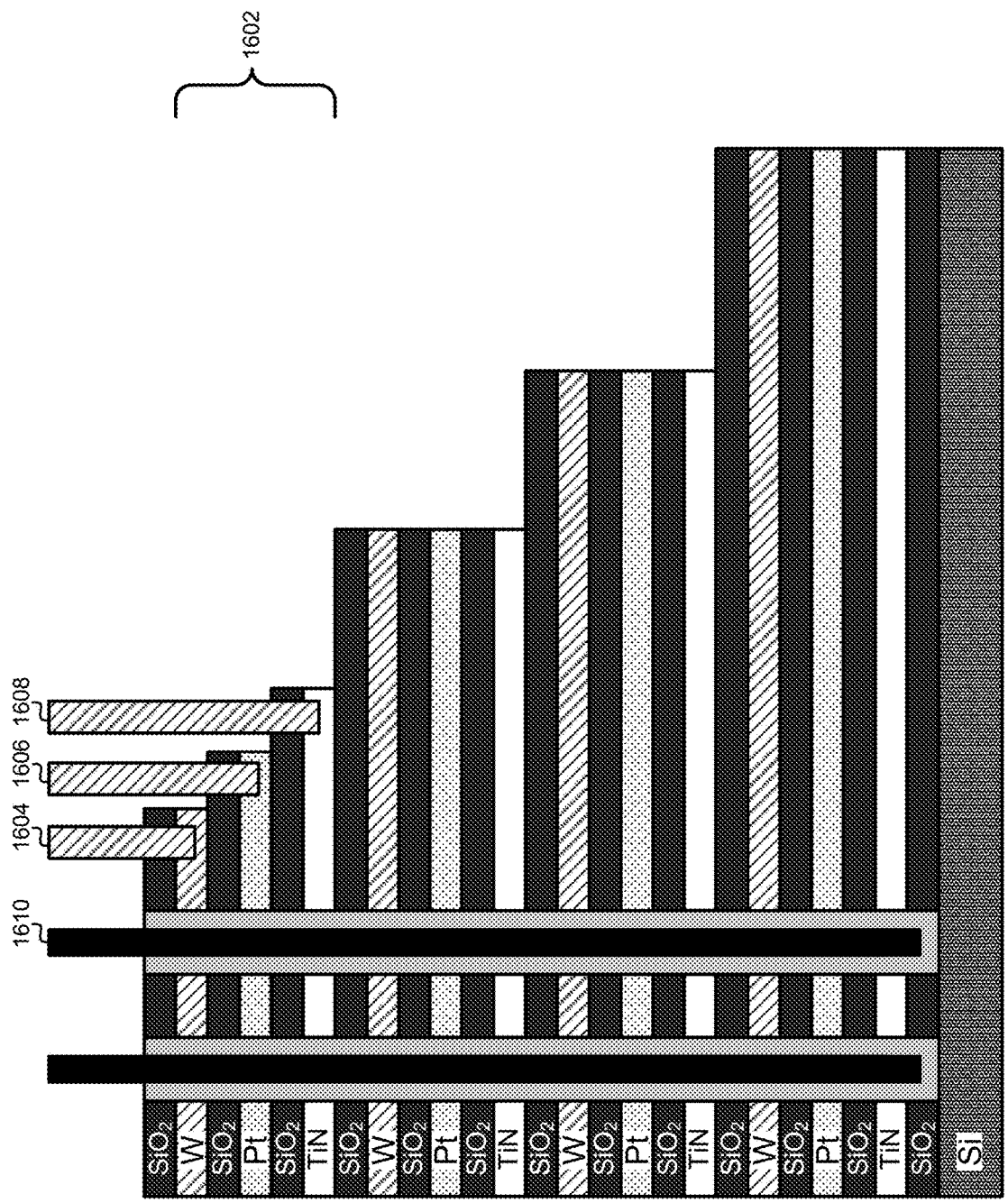
FIG. 16 illustrates a device that may be used as a synapse with individual contacts to each of the lateral metal electrodes, according to some embodiments.

FIG. 16 illustrates a device 1602 that may be used as a synapse with individual contacts to each of the lateral metal electrodes, according to some embodiments. Some embodiments may be used solely as digital and/or analog synapses with multiple levels. To use these embodiments as a multi-level memory cell, the staircase etch may be configured to expose individual lateral metal electrode layers. Each of the vertical contacts (e.g. 1604, 1606, 1608) may be deposited such that they contact a single one of the lateral electrode metal layers to form ferroelectric capacitors in the device with the vertical electrode 1610. For example, the contact 1604 may connect with the first W layer in FIG. 16 without connecting with the first Pt layer and/or the first TiN layer. Similarly, the contact 1606 may connect with the first Pt layer without connecting with the first W layer and/or the first TiN layer. The contact 1608 may connect with the first TiN layer without connecting with the first W layer and/or the first Pt layer.

Although this realization may complicate the topology for creating electrical contacts with the individual metal layers, its main benefit is usage as a synaptic cell or as a bit-addressable, non-volatile memory cell that enables polarization logic. Because each of the contacts 1604, 1606, 1608 connect exclusively with individual metal electrode layers in the device, the individual switching regions in the ferroelectric material can be controlled discreetly and thus may increase the storage capacity of this non-volatile memory element. Instead of measuring only a cumulative effect of the voltage applied to a single pairs of contacts, this device can represent discrete states as each electrode is controlled individually in a bit-addressable fashion. While this results in a relatively large number of vertical contacts, the device can function as a multi-level-memory cell. This realization of a vertical WF-engineered ferroelectric capacitive memory device can enable high-speed, low-power 3D NAND architectures to possibly replace the slower, charge-trapping Flash memories. Note that it is preferable to use the layer arrangement illustrated in FIG. 8 and/or FIG. 16 with isolator layers between each of the metal layers. Creating individual contact with each lateral metal electrode layer in, for example, FIG. 11 where the metal electrode layers are provided without intervening barrier layers still allows the device to be used as a synapse, as it is not necessary to individually addresses each region. Thus, the device may be used as a synapse with and without intervening isolator layers.

Figure 17:
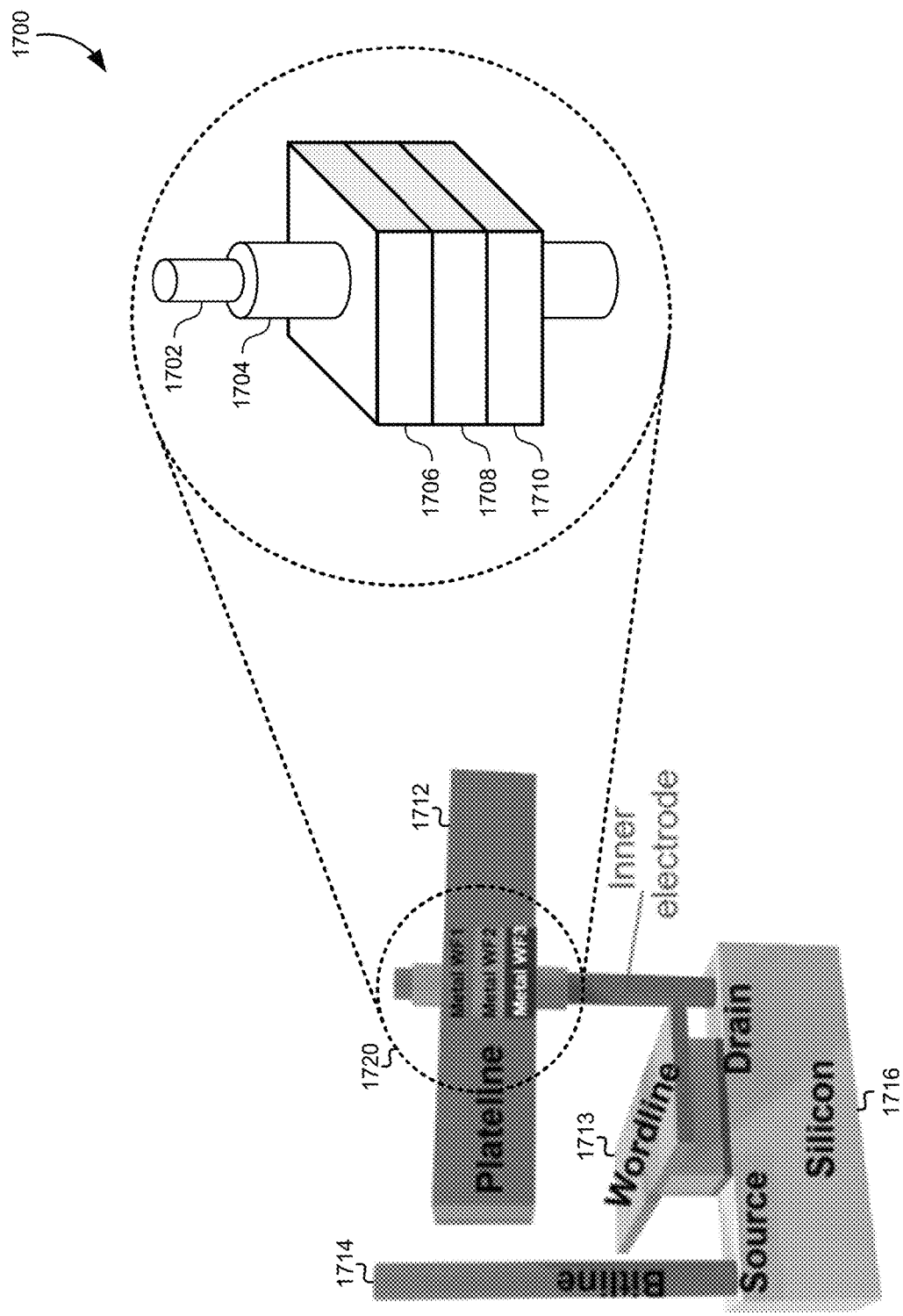
FIG. 17 illustrates a structure for a 1T-1C memory element using the ferroelectric capacitive storage devices described above, according to some embodiments.

FIG. 17 illustrates a structure for a 1T-1C memory element using the ferroelectric capacitive storage devices described above, according to some embodiments. In this example, the 1C portion of the circuit may include the multi-metal device described above. In this example, the device need not include intervening isolator layers between the lateral metal electrode layers. Thus, the ferroelectric device may include a first metal layer 1706, a second metal layer 1708, and/or a third metal layer 1710, each of which may have a different work function associated therewith. Vertically, the device 1720 may include a conductive electrode 1702 surrounded by a ferroelectric material 1704.

The device 1702 may have each of the metal layers integrated with a plate line 1712. The inner electrode 1702 may be connected to a drain of a standard transistor layout in the silicon wafer. For example, the transistor 1716 may include doped source/drain regions along with a world line 1713 and a bit line 1714. The layers comprising the world line, the source, the drain, the plate line 1712, and the metal layers 1706, 1708, 1710 of the ferroelectric device 1720 may be deposited using standard techniques on a silicon wafer, such as the existing approaches for DRAM and 1T-1C memories.

Figure 18A:
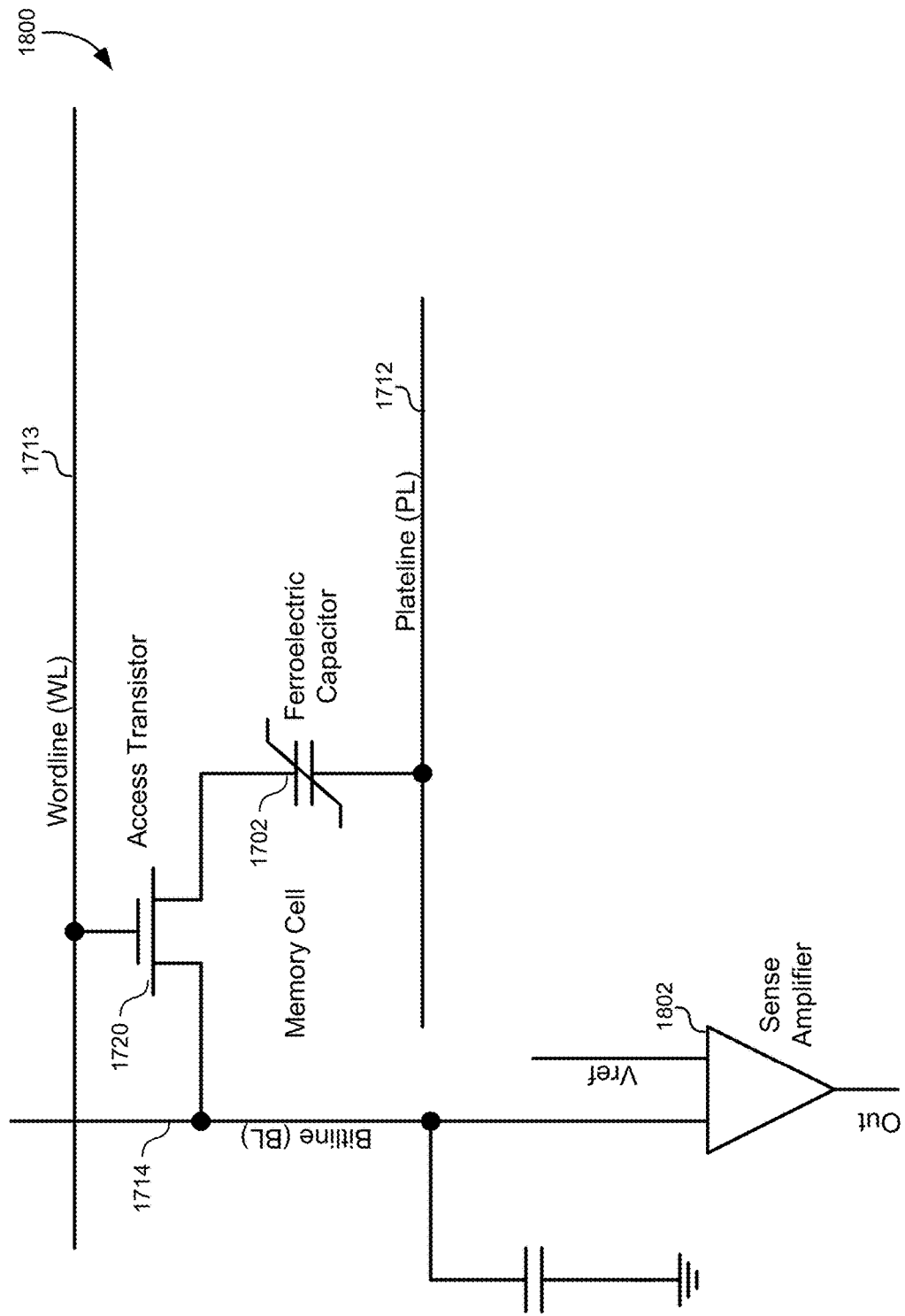
FIG. 18A illustrates a circuit diagram of the 1T-1C memory circuit of FIG. 17, according to some embodiments.

FIG. 18A illustrates a circuit diagram of the 1T-1C memory circuit of FIG. 17, according to some embodiments. The transistor 1720 may function as an access transistor, with its gate connected to the world line 1713 and the source connected to the bit line 1714. The drain of the access transistor 1720 may connect to the inner electrode of the ferroelectric capacitor 1702. In some embodiments, a series of electrodes may be connected to the drain of the transistor instead of simply connecting to the inner electrode. Each of the lateral metal electrode layers may connect to the plate line 1712. To store a value in the ferroelectric capacitor 1702, voltage pulses may be applied to the plate line 1712 and the word line 1713. However, in contrast to traditional binary state memories, the size of the pulses applied to the plate line 1712 and/or the word line 1713 need not be uniform. Voltage pulses of smaller amplitude or shorter length may serve to switch only a portion of the ferroelectric material for the ferroelectric capacitor 1702. This allows the ferroelectric capacitor 1702 to store multiple states as described in detail above. When the memory cell is read, the charge from the ferroelectric capacitor 1702 may be pushed out of the device on the bit line 1714 to trigger a sense amplifier 1802, which detects a capacitance change on the BL output. Since this operation is destructive a refresh operation may be used to rewrite the synaptic weight back to ferroelectric active layer.

The embodiments described above have focused on a ferroelectric capacitive element being formed between a vertical inner electrode surrounded by a ferroelectric material that is connected to a contact through a plurality of lateral metal electrodes, each having a different work function. In addition to a ferroelectric capacitive element, some embodiments may implement a transistor using a similar design. Transistor implementations may use the same lateral layout of metal electrode layers that are optionally separated by isolator layers. However, the transistor implementations may use different materials in place of the vertical inner electrode to instead form a transistor with multiple gates. The transistor implementations may also use a traditional semiconductor approach to generate highly doped semiconductor regions that may be used as a drain and a source for the transistor.

Figure 18B:
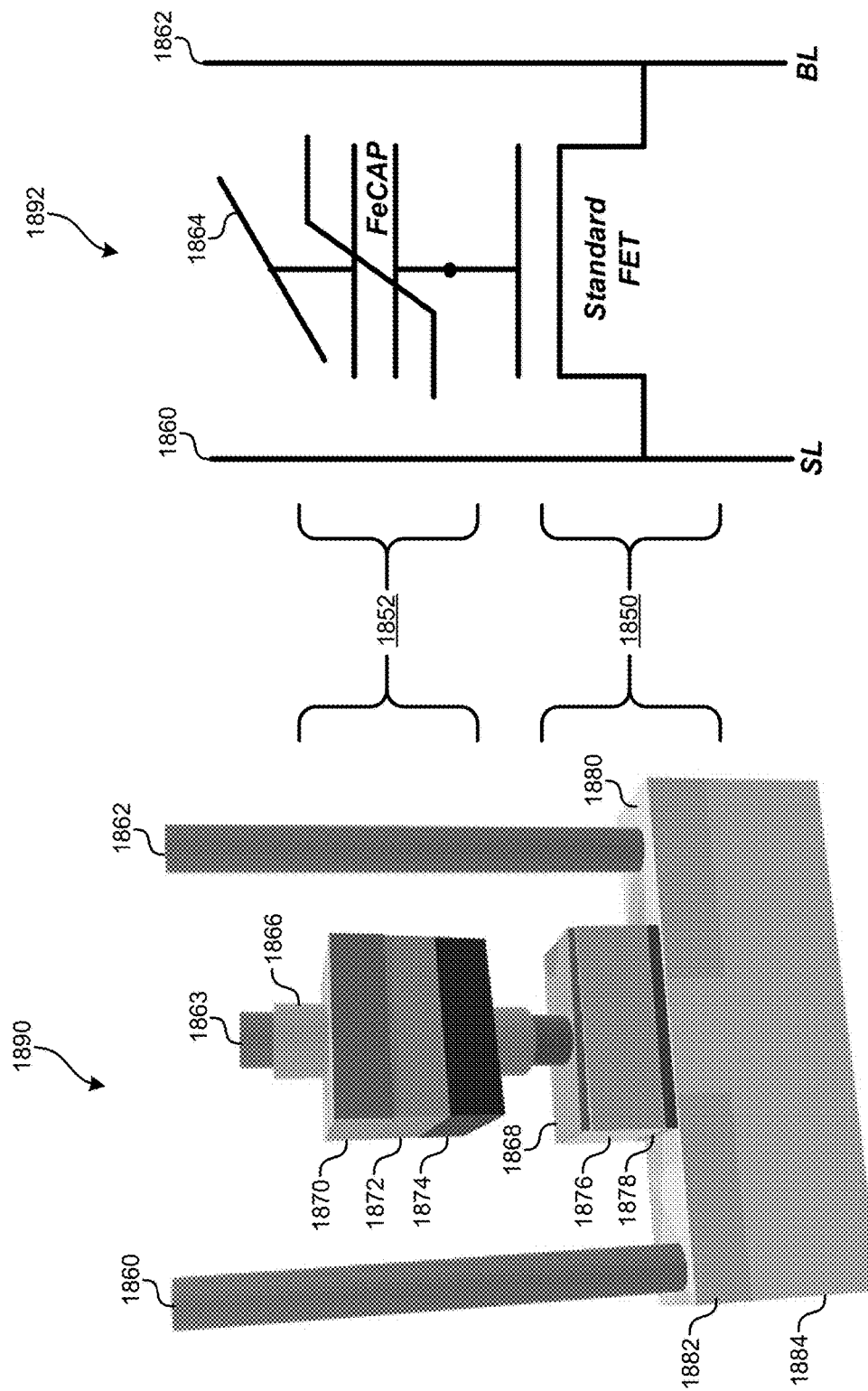
FIG. 18B illustrates an alternate configuration for a 1T-1C cell, according to some embodiments.

FIG. 18B illustrates an alternate configuration for a 1T-1C cell, according to some embodiments. In comparison to FIG. 18A, FIG. 18B may use a standard front end of line (FEoL) FET 1850 with a ferroelectric capacitor 1852 (which may be realized in back end of line) attached to the gate 1868 of the transistor 1850. Specifically, a FEoL FET 1850 may be formed on a substrate 1884 with doped source 1882 and drain 1880 regions. A source/select line 1860 may be connected to the source 1882 of the transistor 1850, while the bit line 1862 may be connected to the drain 1880 of the transistor 1850. The gate may be formed using an interface 1878 and a high-k dielectric 1876 followed by a metal layer to form the gate 1868 (or internal gate). The ferroelectric capacitor 1852 may be coupled to the gate 1868 of the transistor 1850. As described in detail herein, the word line 1864 may be contacted to the vertical contact 1863 in the ferroelectric capacitor stack. A ferroelectric material 1866 may be wrapped around a conductor to form the internal electrode 1864 of the cylindrical ferroelectric capacitor. A plurality of metal layers 1870, 1872, 1874 may form the lateral metal layers, each of which may have a different work function as described above and wrap and for a cylindrical ferroelectric capacitor.

Figure 19:
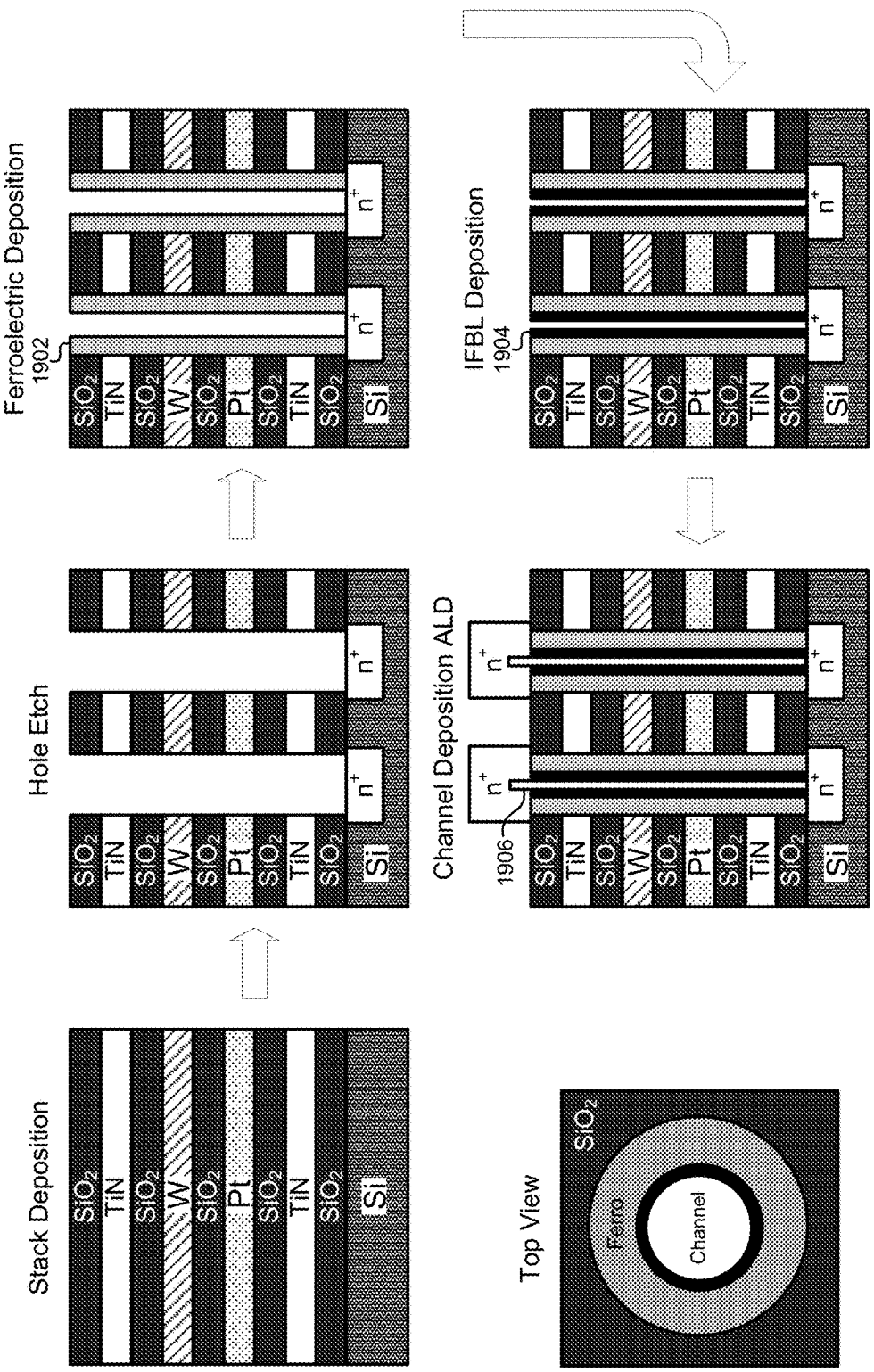
FIG. 19 illustrates a simplified process for fabricating an array of transistor elements, according to some embodiments.

FIG. 19 illustrates a simplified process for fabricating an array of transistor elements, according to some embodiments. For the sake of brevity and simplicity, steps such the staircase etch, substrate doping, and depositing the select gates have omitted for clarity. This process is similar to the process described above in relation to FIG. 6, except this process may be used to form a transistor rather than a capacitive element. The following fabrication process may form transistor array of individual transistor elements with multiple gate electrodes formed by the lateral metal electrode layers. Specifically, these embodiments may use a series of different types of metal for each metal layer in the alternating layers of metal and isolator described above. Each of the metal layers may be associated with a different work function, and the different work function may cause the corresponding gate portion of the transistor to conduct when a different voltage is applied. These multiple conductive states are created by the work function difference between horizontal electrode metals and the silicon used for the vertical elements.

The example in FIG. 19 uses different metals for each of the alternating layers of metal between the isolator layers. For example, a single memory device may use a first metal layer having a first work function (e.g., TiN, having a work function of approximately 4.5 eV) followed by an isolator layer or an inter-dielectric layer (IDL) (e.g., $SiO_2$). The transistor may then use a second metal layer having a second work function that is different from the first work function (e.g., Pt, having a work function of approximately 5.6 eV) followed by another isolator layer. The transistor may then use a third metal layer having a third work function that is different from both the first work function and the second work function (e.g., W, having a work function of approximately 5.1 eV). Each of these three different metals with different work functions may generate the different switching voltages on the gate of the transistor, which may cause the transistor to conduct differently at different levels of applied gate voltages. As each of these metals individually reach a voltage causing the channel to conduct, the overall current state of the transistor may gradually progress through a number of intermediate states. Each of these metal layers may have a thickness of between approximately 3 nm and approximately 50 nm.

It should be emphasized that using three different metals in FIG. 19 is provided merely by way of example and is not meant to be limiting. Other embodiments may use more or fewer metal layers for a single device. For example, some embodiments may use two layers, four layers, six layers, eight layers, and so forth, each using different metals and each having different work functions.

In contrast to the ferroelectric capacitors formed above in FIG. 6, transistor elements may be formed in FIG. 19 by depositing different materials in the etched holes through the different metal layers. A ferroelectric material 1902, such as a hafnium-based material, may be deposited in each of the holes as described above. However, instead of depositing a conductive metal, such as TiN into the center of the holes to be surrounded by the ferroelectric material, the transistor process may instead deposit an interface material that provides a high-quality interface between the silicon material channels and the high-k material, referred to as an interfacial buffer layer (IFBL) 1904, which may be fabricated from any barrier material, such as silicon dioxide. Moreover, in the case of a transition to indium gallium zinc oxide (IGZO)

channel materials and oxide-semiconductors, the IFBL may be omitted to hence lower the operation condition. This may apply to all embodiments described herein. However, some channel materials like IGZO may require introduction of an $Al_2O_3$ or SiN-based barrier layer that may act as an $H_2$ barrier to prevent diffusion and damage of the channel during an anneal process. Finally, a channel 1906 may be deposited to fill the center of the etched vertical holes using a silicon or polysilicon material. Although not illustrated explicitly in FIG. 19, some embodiments may also selectively fill the walls with silicon or polysilicon material to allow for the deposition of another, more central layer, forming what is known as a "macaroni" type NAND structure, which may exhibit better electrostatic characteristics compared to the simple fill-type channel. Some embodiments may also add a doped silicon region on top of the channel 1906. Combined with the doped region at the bottom of the channel 1906, these may form the traditional source and drain of a transistor.

Figure 20A:
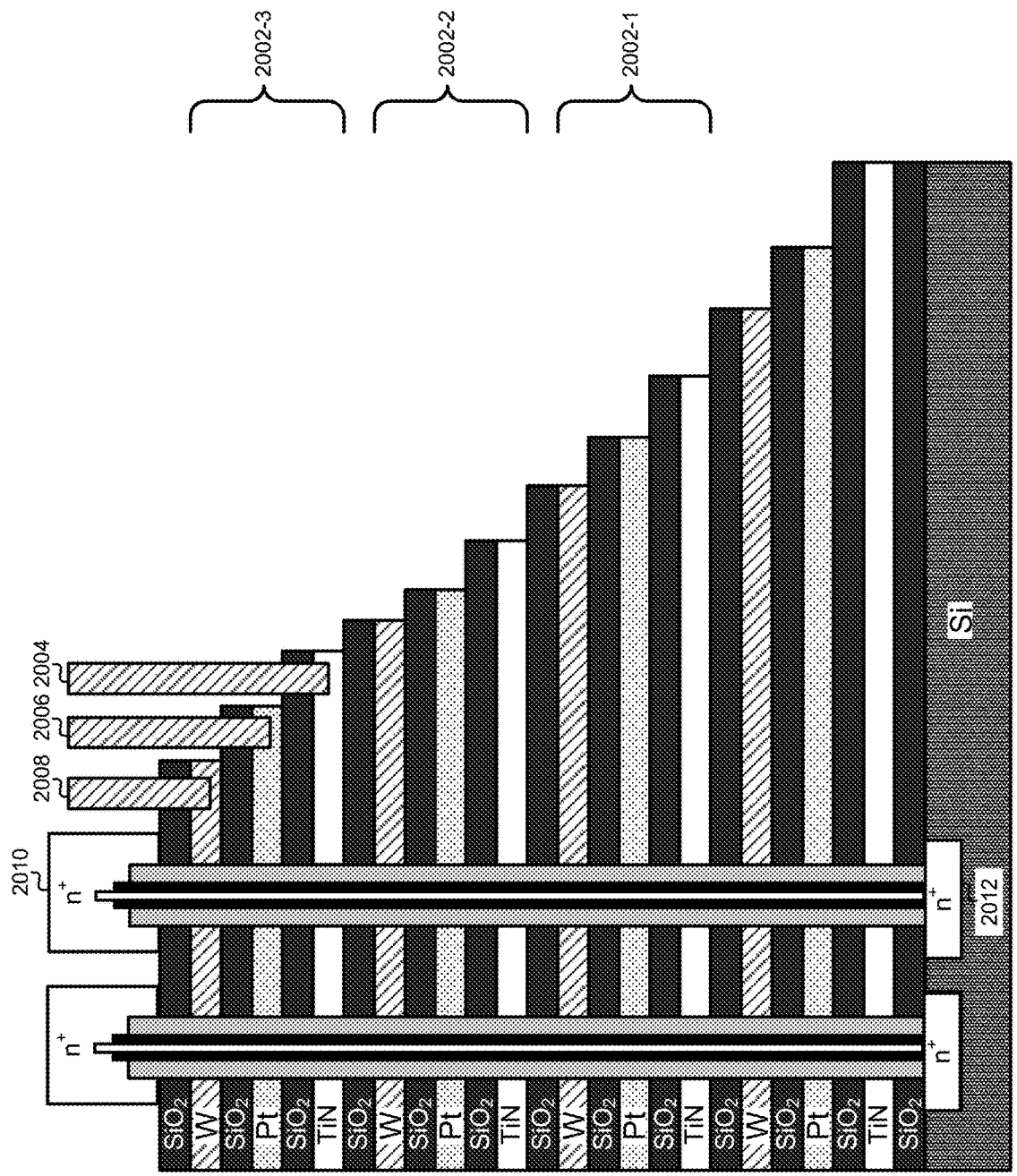
FIG. 20A illustrates how multiple devices having different internal metal layers may be stacked vertically within a multi-tier string of the transistor array, according to some embodiments.

FIG. 20A illustrates how multiple devices having different internal metal layers may be stacked vertically within a multi-tier string of the transistor array, according to some embodiments. Instead of depositing layers such that every pair of metal and isolator layers forms a single transistor gate, a transistor may be formed from multiple different metal layers separated by isolator layers. For example, a plurality of transistors may be stacked vertically using the layered fabrication approach described above. A first transistor 2002-1 may include alternating layers of TiN, $SiO_2$, Pt, $SiO_2$, W, $SiO_2$, and so forth. A second transistor 2002-2 may include alternating layers of the same materials and/or other materials. The metal layers in the first transistor 2002-1 may be the same as the metal layers in the second device 2002-2. Alternatively, other transistors in the vertical stack may use different numbers and/or different types of metal layers.

FIG. 20A illustrates a side, staircase view of the vertical transistor stack. This side view illustrates two of the vertical holes that are filled with a ferroelectric material 1902, such as hafnium. The vertical holes may then include a barrier layer, such as silicon dioxide, before being filled with a channel material, such as silicon or polysilicon or any other oxide-semiconductor, such as IGZO. The channel material may contact a doped region of the stack that forms the drain/source of the transistors in each vertical string. For example, a doped region 2010 may form a drain of the transistors in the vertical string, while another doped region 2012 may form a source of the transistors in the vertical string. The other, lateral electrodes forming the gate(s) of each transistor in the string may be individually contacted through the metal contacts which fill the holes that are etched to an appropriate depth in the staircase such that the contacts 2008, 2006, 2004 each contact the individual metal layers for each gate. In this example, the multiple metal and isolator layers for each transistor may be fabricated using a staircase etch process as depicted in FIG. 20A. This process exposes a vertical surface for each gate electrode in a staircase pattern such that the individual gate electrodes for each device do not contact the metal layers for other transistor gates above the current transistor gate in the vertical stack.

For example, a first memory device 2002-3 may be formed using the vertical channel connecting the drain 2010 to the source 2012. In this example, the lateral/second electrodes may be formed using any metals, such as W, Pt and/or TiN, or alloys such TiAlN where the Al content may be tuned to obtain the desired metal work function. The contacts 2004, 2006, 2008 may be formed by first etching a vertical hole into the metal/isolator layers that are part of the first transistor gate. For example, as depicted in FIG. 20A, holes may be etched such that they penetrate down to the each of the metal layers forming the gate of the transistor 2002-3 (e.g., metal layers TiN, W, and Pt) and the intervening isolator layers (e.g., $SiO_2$). The depth of the etch for each whole may be controlled by the time of the etching process. For example, the process may be calibrated such that the etch penetrates a predetermined distance per time unit, and the time of the etch may thus be controlled to determine the depth of the etch. When the proper depth is reached, the resulting hole can be filled with a second metal to form each of the contacts 2004, 2006, 2008.

The transistor 2002-3 may be comprised of the multiple separate metal layers (e.g., TiN, Pt, W, or alloys such TiAlN) with intervening isolator layers. The contacts 2004, 2006, 2008 may connect to each of the separate lateral metal layers in the transistor 2002-3 to reach to second lateral electrode (s) through the contacts. Individual gate regions may be created in the first transistor 2002-3 for each of the metal-ferroelectric-isolator-channel junctions through the contact 2004, 2006, 2008 to the lateral electrode(s) formed by each of the metal layers. Because each of the metal layers in the transistor 2002-3 are fabricated using a different material, each of the metal layers may be associated with a different work function. Different voltages applied across the electrodes 2004, 2006, 2008 may cause the different regions associated with the different metal layers to switch at different input voltages. This allows the transistor 2002-3 to step through multiple conductive states in a single transistor gate. The different work functions allow the three different gate regions to be programmed individually with different conductive characteristics.

Specifically referring to a transistor 2002-3, each of the lateral metal layers may form a portion of the gate for the transistor 2002-3. In this example, each of the lateral metal layers is connected to a corresponding contact 2008, 2006, 2004. Additionally, the source and drain through which the channel conducts may be implemented by doping a portion of silicon layers 2010, 2012 at the top and/or bottom of each of the vertical "strings" for the transistor.

Figure 20B:
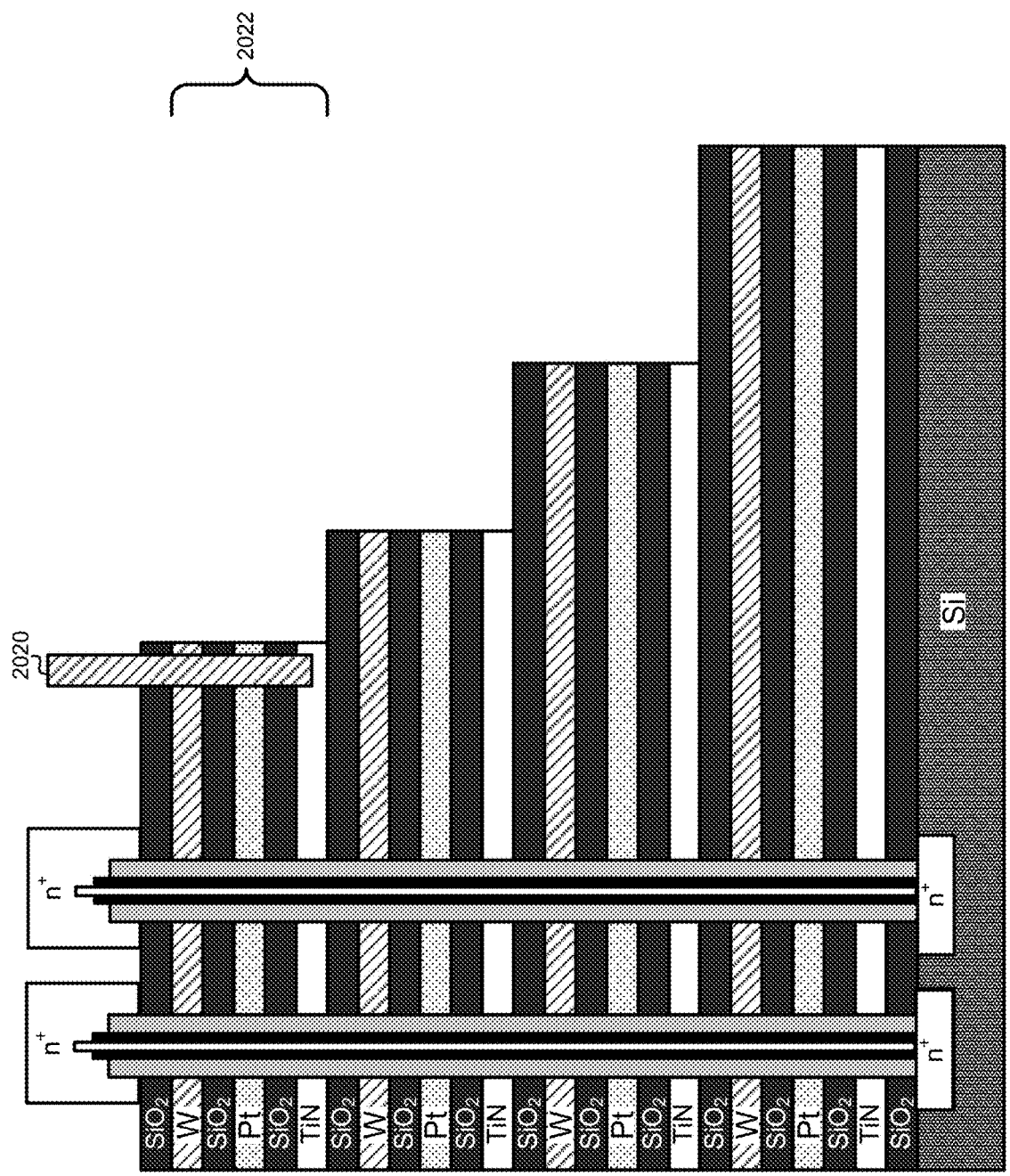
FIG. 20B illustrates how multiple devices having different internal metal layers may be stacked contacted with a single contact, according to some embodiments.

FIG. 20B illustrates how multiple devices having different internal metal layers may be stacked contacted with a single contact, according to some embodiments. As illustrated in FIG. 20A, a transistor may be formed from multiple different metal layers separated by isolator layers. For example, a plurality of transistors may be stacked vertically using the layered fabrication approach described above. However, instead of using separate contacts for each lateral metal layer in a device, a single contact may be used that interfaces with each of the lateral metal layers. As illustrated in FIG. 20B, a single contact may interface with each of the three lateral metal layers in a single device 2022. Thus, a single voltage may be applied to the contact 2020 to simultaneously turn on/off individual gate regions of the transistor device 2022.

Because each of the metal layers in the transistor device 2022 are fabricated using a different material, each of the metal layers may be associated with a different work function. Different voltages applied across the electrode 2020 may cause the different regions associated with the different metal layers to switch at different input voltages. This allows the transistor 2002-3 to step through multiple conductive states in a single transistor gate. For example, as a voltage applied to the contact 2020 increases, individual gate regions may switch sequentially until the entire gate of the device 2022 has switched to a conductive state. This allows the device 2022 to function as a synapse.

Figure 21:
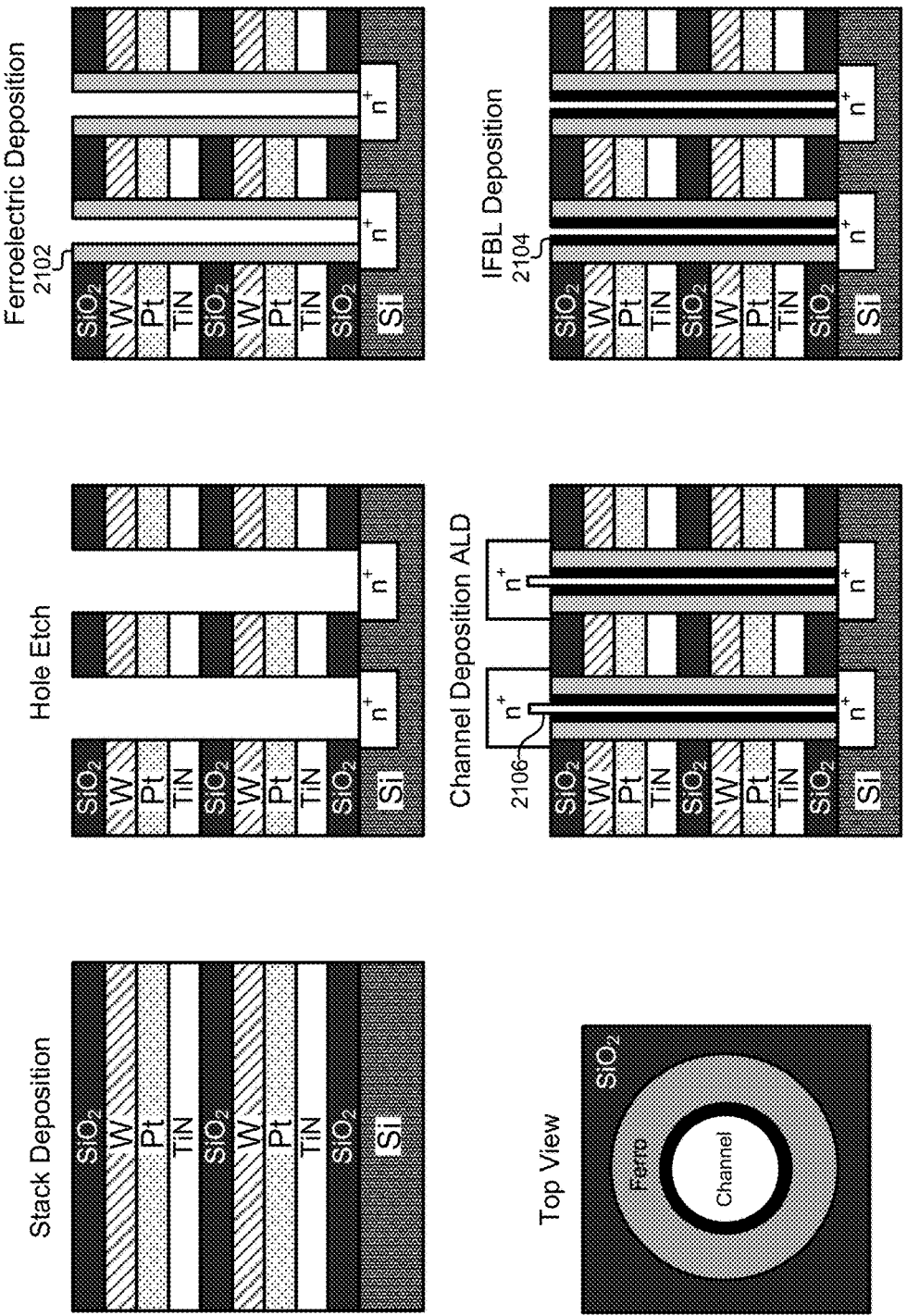
FIG. 21 illustrates vertical transistors that may be formed without requiring, inter-layer isolator or barrier layers that separate different metal layers, according to some embodiments.

FIG. 21 illustrates vertical transistors that may be formed without requiring, inter-layer isolator or barrier layers that separate different metal layers, according to some embodiments. These embodiments are similar to those illustrated above in FIG. 19, the exception being that the isolating layers between the metal layers have been removed from the fabrication process. A single transistor device may include any number of different internal metal layers (e.g., TiN, Pt, W, alloys such TiAlN, etc.). These layers may be deposited using the fabrication processes described above directly on top of each other in the vertical stack. In the example of FIG. 21, each transistor comprises three internal metal layers that form lateral gate electrodes. For example, after depositing a first internal metal layer comprised of TiN, a second metal layer comprised of Pt may be deposited directly on top of the first metal layer. Likewise, a third metal layer comprised of W may be deposited directly on top of the second metal layer.

To separate one device tier from another in the vertical stack, or "string," a layer of an isolator material may be deposited between each of the stacks of internal metal layers forming the lateral electrodes between the devices to separate the different devices. For example, an isolator layer comprised of $SiO_2$ may be deposited on top of the third metal layer in the device of FIG. 21 to isolate multiple gates from each other. After the isolator layer has been deposited, the process for depositing multiple metal layers forming the lateral electrodes may be repeated to form another transistor device on top of the existing transistor device. Although the example in FIG. 21 shows only two transistor devices in the vertical stack, transistors fabricated in practice may have many more transistor devices layered vertically that are not shown explicitly in this example.

The rest of the fabrication process may proceed as described above. Specifically, holes may be etched through each of the metal and isolator layers in each of the isolator-separated rows of material. A ferroelectric material, such as doped HfOx or a HfZrOx mixture may be deposited such that it lines each of the holes (e.g., $HfZrO_x$), and isolator layer, such as silicon dioxide, may line the surface of the ferroelectric material, and the remaining area inside of each of the holes may be filled by depositing a channel material, such as silicon. Again, although the example of FIG. 21 shows only two holes, devices fabricated in practice may have many holes in each of the rows that are not shown explicitly in this example. Additionally, the types of metal and the ferroelectric/isolator/channel materials used in FIG. 21 are provided merely by way of example and are not meant to be limiting. Other ferroelectric, channel, isolator, and metal materials may be used without limitation. All of the other steps in the fabrication process described above in this disclosure may apply to the device of FIG. 21, including depositing doped silicon regions above/below the channel 2106 to create source/drain regions for a transistor.

Figure 22:
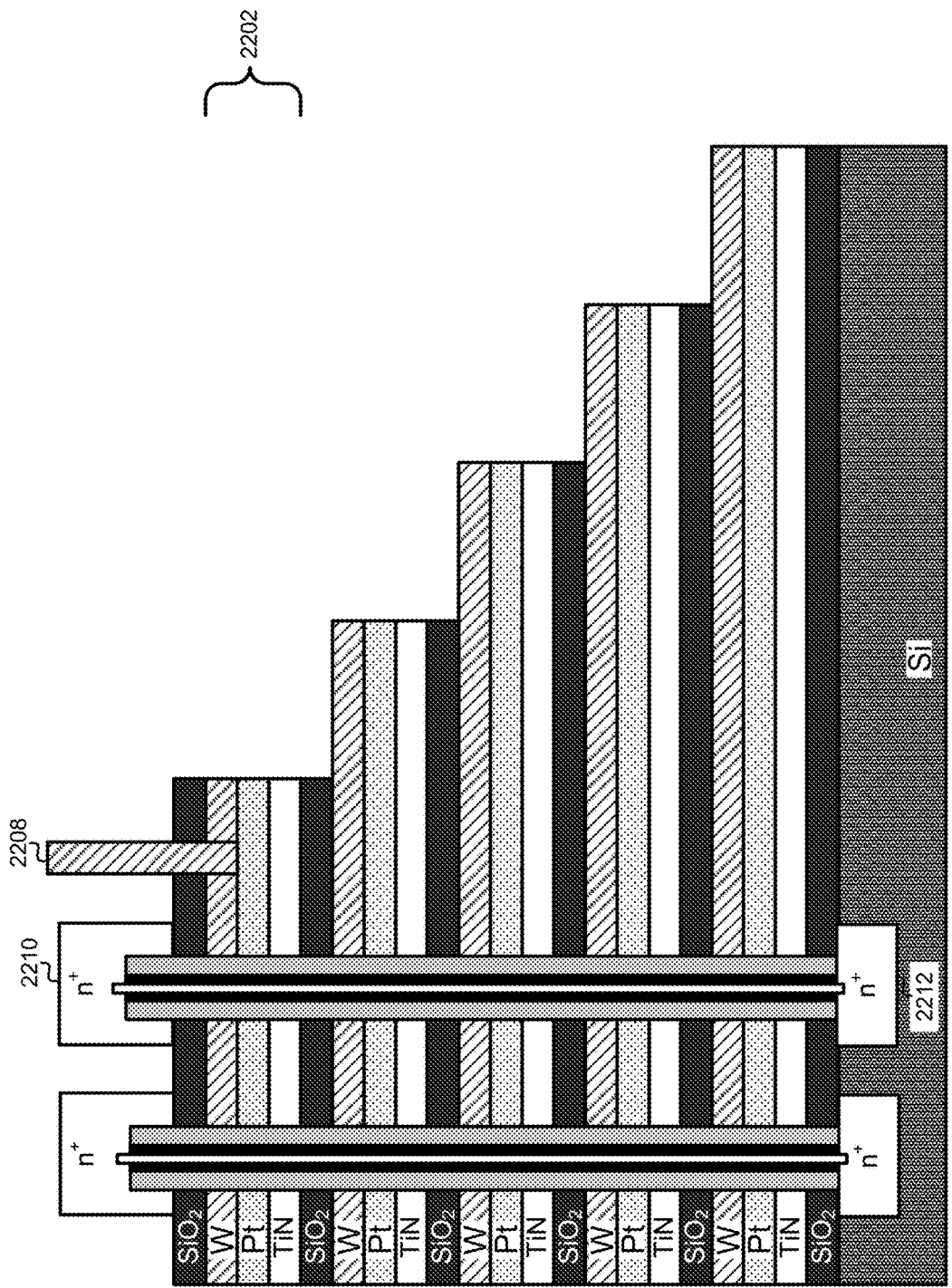
FIG. 22 illustrates a side, staircase view of a vertical transistor stack, shown in FIG. 21, without intervening isolator layers, according to some embodiments.

FIG. 22 illustrates a side, staircase view of a vertical transistor stack, shown in FIG. 21, without intervening isolator layers, according to some embodiments. This side view illustrates two of the vertical holes that are filled with a ferroelectric layer, an isolator layer, and a channel material as described above. Each of the channels may be connected to a source 2212 region and a drain 2210 region. The lateral electrodes for each transistor gate may be individually contacted by depositing a contact metal in holes that are etched to an appropriate depth such that resulting contact 2208 interfaces with the individual lateral metal layers for a single transistor gate. In this example, the multiple metal layers and single isolator layer for each transistor gate may be fabricated using a staircase etch process as described above. This process exposes a vertical surface for each device in a staircase pattern such that the gate electrode for each device does not contact the metal gate layers for other transistors above the current transistor in the vertical stack.

For example, a transistor 2202 may be formed using the channel connecting the drain 2210 and the source 2212. The channel may be separated from the gate electrode by the isolator layer and the ferroelectric material. The gate to the channel may be formed by the contact 2208, which penetrates a series of lateral electrode materials that constitute a gate electrode. The vertical contact 2208 interfacing with the lateral gate electrode materials may be formed by first etching a vertical hole in the metal layers that are part of the transistor 2202. For example, as depicted in FIG. 22, a hole may be etched such that it penetrates down to any of the internal, lateral metal gate layers, such as the first W layer. The depth of the etch may be controlled by the time the etching process is allowed to proceed. For example, the process may be calibrated such that the etch penetrates a predetermined distance per time unit, and the time of the etch may thus be controlled to determine the depth of the etch. When the corresponding amount of time has passed, the proper depth may be reached, and the resulting hole may be filled with a contact metal such that the contact 2208 reaches the lateral metal gate electrodes composed of the multiple metal layers. In this example, W is used as a material for the vertical contact 2208, but any other metal may be used in other embodiments.

In the foregoing description, a number of metals were specifically used as examples for electrodes, metal layers, and other conductive layers (e.g., Ti, W, Pt, etc.). However, many different metals and/or alloys may be used without limitation as metal layers, electrodes, or conductors in any of the embodiments described above. For example, any combinations of different metals and/or alloys may be used to achieve the desired work-function differential. Other such metals may include Ti, Al, Co, La, Mn, Mo, Ta, Ru, polySi, Ir, IrOx, RuOx, Pt, W, TiN, TaN, WN, Pd, Te and/or alloys of any of these materials. Additionally, although hafnium-based materials were described above in the examples for a ferroelectric material, any other ferroelectric material may also be used without limitation in any embodiment. Other ferroelectric materials may include HfZrOx-HZO, strained HfOx, Sc doped AlN doped HfOx and HZO where the dopant(s) comprise Si, Al, Y, Sc, Ga, Ti, Ta, La, N, and/or similar similar materials. Finally, any channel for any of the transistor-based devices described above may use, without limitation, materials such as Si, polySi, SiGe, IGZO and other amorphous semiconductors and/or semiconducting oxides. Any combinations of any of the metals, ferroelectric materials, and/or channel materials may be used in any combination and without limitation in any device described herein.

In the foregoing description, the term "approximately" may be interpreted to mean within 10% of a stated value. For example, approximately 10.0 mm may be interpreted as a range of between 9.0 mm and 11.0 mm. The term "substantially" may be interpreted to mean at least approximately 90% of a value. For example, substantially filling an area may be interpreted as filling approximately 90% of an area.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the example embodiments will provide those skilled in the art with an enabling description for implementing an example embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, aspects various embodiments are described with reference to specific embodiments, but those skilled in the art will recognize that the invention is not limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A ferroelectric capacitive device comprising:
a plurality of metal layers comprising:
a first metal layer comprising a first metal having a first work function; and
a second metal layer comprising a second metal having a second work function that is different from the first work function, wherein the first metal layer is approximately parallel to the second metal layer;
a vertical contact that contacts the first metal layer;
a vertical electrode that is approximately perpendicular to the first metal layer and approximately perpendicular to the second metal layer; and
a ferroelectric material that surrounds the vertical electrode and directly contacts the vertical electrode and directly contacts the plurality of metal layers to form the ferroelectric capacitive device with a plurality of switching regions in the ferroelectric material comprising:
a first switching region between the vertical electrode and the first metal layer that switches in response to a voltage between the vertical electrode and the vertical contact; and
a second switching region between the vertical electrode and the second metal layer that switches in response to the voltage between the vertical electrode and the vertical contact.

2. The ferroelectric capacitive device of claim 1, further comprising an isolator layer between the first metal layer and the second metal layer.

3. The ferroelectric capacitive device of claim 1, wherein the vertical contact is electrically connected to the second metal layer.

4. The ferroelectric capacitive device of claim 1, wherein:
the plurality of metal layers further comprises a third metal layer comprising a third metal having a third work function that is different from the first work function and different from the second work function, and the third metal layer is approximately parallel to the second metal layer; and
the plurality of switching regions in the ferroelectric material further comprises a third switching region between the vertical electrode and the third metal layer that switches in response to the voltage between the vertical electrode and the vertical contact.

5. The ferroelectric capacitive device of claim 1, wherein no isolator barrier is between the first metal layer and the second metal layer such that the first metal layer provides an electrical contact between the second metal layer and the vertical contact.

6. The ferroelectric capacitive device of claim 1, wherein the vertical electrode comprises a vertical cylinder inside of the ferroelectric material such that the ferroelectric material contacts each of the plurality of metal layers.

7. The ferroelectric capacitive device of claim 1, wherein a second ferroelectric capacitive device is stacked on top of the ferroelectric capacitive device and a third ferroelectric capacitive device is beneath the ferroelectric capacitive device in a vertical stack.

8. The ferroelectric capacitive device of claim 1, wherein the plurality of metal layers are connected to a plate line of a memory cell in a memory array, and the vertical electrode is connected to a drain of a transistor of the memory cell.

9. The ferroelectric capacitive device of claim 1, wherein the vertical electrode is connected to a gate of a transistor of a memory cell in a memory array.

10. The ferroelectric capacitive device of claim 1, wherein:
the first metal layer comprises platinum, titanium, tungsten, aluminum, or an alloy thereof; and
the second metal layer comprises platinum, titanium, tungsten, aluminum, or an alloy thereof.

11. A method of fabricating a ferroelectric capacitive device, the method comprising:
depositing a plurality of metal layers comprising:
a first metal layer comprising a first metal having a first work function; and
a second metal layer comprising a second metal having a second work function that is different from the first work function, wherein the first metal layer is approximately parallel to the second metal layer;
etching a vertical hole in the plurality of metal layers; and
filling the vertical hole with:

a vertical electrode that is approximately perpendicular to the first metal layer and approximately perpendicular to the second metal layer; and a ferroelectric material that surrounds the vertical electrode and directly contacts the vertical electrode and directly contacts the plurality of metal layers to form the ferroelectric capacitive device with a plurality of switching regions in the ferroelectric material comprising:

a first switching region between the vertical electrode and the first metal layer that switches in response to a voltage between the vertical electrode and a vertical contact that contacts the first metal layer; and a second switching region between the vertical electrode and the second metal layer that switches in response to the voltage between the vertical electrode and the vertical contact that contacts the first metal layer.

12. A ferroelectric transistor comprising:

a plurality of metal layers comprising:

a first metal layer comprising a first metal having a first work function; and a second metal layer comprising a second metal having a second work function that is different from the first work function, wherein the first metal layer is approximately parallel to the second metal layer;

a vertical contact that contacts the first metal layer;

a vertical channel that is approximately perpendicular to the first metal layer and approximately perpendicular to the second metal layer;

a vertical buffer layer that surround the vertical channel; and a ferroelectric material that surrounds the vertical buffer layer and contacts the plurality of metal layers to form the ferroelectric transistor with a plurality of gate regions in the ferroelectric material comprising:

a first gate region between the vertical channel and the first metal layer that switches in response to a voltage between the vertical channel and the vertical contact; and a second gate region between the vertical channel and the second metal layer that switches in response to the voltage between the vertical channel and the vertical contact.

13. The ferroelectric transistor of claim 12, further comprising an isolator layer between the first metal layer and the second metal layer.

14. The ferroelectric transistor of claim 12, wherein the vertical contact also contacts the second metal layer.

15. The ferroelectric transistor of claim 12, further comprising a second vertical contact that contacts the second metal layer, wherein:

the vertical contact does not contact the second metal layer; and the second vertical contact does not contact the first metal layer.

16. The ferroelectric transistor of claim 12, wherein the plurality of metal layers further comprises a third metal layer comprising a third metal having a third work function that is different from the first work function and different from the second work function.

17. The ferroelectric transistor of claim 12, wherein no isolator barrier is between the first metal layer and the second metal layer such that the first metal layer provides an electrical contact between the second metal layer and the vertical contact.

18. The ferroelectric transistor of claim 12, wherein a second ferroelectric transistor is stacked on top of the ferroelectric transistor and a third ferroelectric transistor is beneath the ferroelectric transistor in a vertical stack such that the vertical channel is shared between the ferroelectric transistor, the second ferroelectric transistor, and the third ferroelectric transistor.

19. The ferroelectric transistor of claim 18, further comprising:

a first doped semiconductor region on a bottom of the vertical stack forming a drain for the ferroelectric transistor, the second ferroelectric transistor, and the third ferroelectric transistor; and a second doped semiconductor region on a top of the vertical stack forming a source for the ferroelectric transistor, the second ferroelectric transistor, and the third ferroelectric transistor.

20. The ferroelectric transistor of claim 12, wherein the vertical channel comprises an indium gallium zinc oxide (IGZO) material.

* * * * *